(12) United States Patent
Nakamura et al.

(10) Patent No.: US 11,637,176 B2
(45) Date of Patent: Apr. 25, 2023

(54) SEMICONDUCTOR DEVICE

(71) Applicant: Nuvoton Technology Corporation Japan, Kyoto (JP)

(72) Inventors: Hironao Nakamura, Osaka (JP); Ryosuke Okawa, Nara (JP); Tsubasa Inoue, Osaka (JP); Akira Kimura, Kyoto (JP); Eiji Yasuda, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/859,799

(22) Filed: Jul. 7, 2022

(65) Prior Publication Data

US 2023/0101684 A1 Mar. 30, 2023

Related U.S. Application Data

(63) Continuation of application No. PCT/JP2021/034220, filed on Sep. 17, 2021.

(51) Int. Cl.
*H01L 29/06* (2006.01)
*H01L 29/08* (2006.01)
(Continued)

(52) U.S. Cl.
CPC ........ *H01L 29/0607* (2013.01); *H01L 27/088* (2013.01); *H01L 29/086* (2013.01);
(Continued)

(58) Field of Classification Search
CPC ..... H01L 29/06; H01L 29/0607; H01L 29/08; H01L 29/086; H01L 29/0865;
(Continued)

(56) References Cited

U.S. PATENT DOCUMENTS

| 5,366,914 A | 11/1994 | Takahashi et al. |
| 7,372,103 B2 | 5/2008 | Zundel et al. |

(Continued)

FOREIGN PATENT DOCUMENTS

| JP | 3999225 B2 | 10/2007 |
| JP | 2009-016571 A | 1/2009 |

(Continued)

OTHER PUBLICATIONS

International Search Report dated Dec. 14, 2021 in International Patent Application No. PCT/JP2021/034220.

(Continued)

*Primary Examiner* — Fazli Erdem
(74) *Attorney, Agent, or Firm* — McDermott Will & Emery LLP

(57) ABSTRACT

Provided is a first vertical field effect transistor in which first source regions and first connection portions via which a first body region is connected to a first source electrode are disposed alternately and cyclically in a first direction in which first trenches extend. In a second direction orthogonal to the first direction, $Lxm \leq Lxr \leq 0.20$ μm holds true where Lxm denotes a distance between adjacent first trenches and Lxr denotes the inner width of a first trench. The lengths of the first connection portions are in a convergence region in which the on-resistance of the vertical field effect transistor at the time when a voltage having a specification value is applied to first gate conductors to supply current having a specification value does not decrease noticeably even when the lengths of the first connection portions are made much shorter.

10 Claims, 16 Drawing Sheets

(51) Int. Cl.
*H01L 29/10* (2006.01)
*H01L 29/78* (2006.01)
*H01L 27/088* (2006.01)

(52) U.S. Cl.
CPC ...... *H01L 29/0865* (2013.01); *H01L 29/0878* (2013.01); *H01L 29/0882* (2013.01); *H01L 29/1095* (2013.01); *H01L 29/7811* (2013.01); *H01L 29/7813* (2013.01)

(58) Field of Classification Search
CPC . H01L 29/087; H01L 29/0878; H01L 29/088; H01L 29/0882; H01L 29/10; H01L 29/1095; H01L 29/78; H01L 29/7802; H01L 29/7811; H01L 29/7813
USPC ........................................................ 257/288
See application file for complete search history.

(56) References Cited

U.S. PATENT DOCUMENTS

| | | | |
|---|---|---|---|
| 2005/0161734 A1 | 7/2005 | Miyata et al. | |
| 2009/0272982 A1* | 11/2009 | Nakamura | H01L 21/0337 257/77 |
| 2015/0279985 A1 | 10/2015 | Philippou et al. | |
| 2015/0295071 A1 | 10/2015 | Hikasa | |
| 2016/0104797 A1* | 4/2016 | Poelzl | H01L 29/404 257/331 |
| 2018/0083137 A1 | 3/2018 | Kobayashi et al. | |
| 2018/0269287 A1 | 9/2018 | Yoshimura et al. | |
| 2019/0319126 A1 | 10/2019 | Matsushima et al. | |
| 2021/0384343 A1 | 12/2021 | Takeuchi et al. | |

FOREIGN PATENT DOCUMENTS

| | | |
|---|---|---|
| JP | 2015-213163 A | 11/2015 |
| JP | 2016-171341 A | 9/2016 |
| JP | 2018-046256 A | 3/2018 |
| JP | 2018-152504 A | 9/2018 |
| JP | 2019-201217 A | 11/2019 |
| JP | 2020-141130 A | 9/2020 |
| WO | 2018/123799 A1 | 7/2018 |

OTHER PUBLICATIONS

English translation of Written Opinion of the International Searching Authority dated Dec. 14, 2021 in International Patent Application No. PCT/JP2021/034220.

Decision to Grant issued in corresponding Japanese Patent Application No. 2022-522573, dated Jul. 19, 2022, with English translation.

\* cited by examiner

FIG. 8

| Parameter | Symbol | Conditions | Min | Typ | Max | Unit |
|---|---|---|---|---|---|---|
| Source-source On-state Resistance | RSS(on)1 | IS = 6.9 A, VGS = 4.5 V | 1.8 | 2.2 | 2.9 | mΩ |
| | RSS(on)2 | IS = 6.9 A, VGS = 3.8 V | 1.7 | 2.4 | 3.1 | |
| | RSS(on)3 | IS = 6.9 A, VGS = 3.1 V | 1.8 | 2.8 | 4.6 | |
| | RSS(on)4 | IS = 6.9 A, VGS = 2.5 V | 3.0 | 5.0 | 9.8 | |

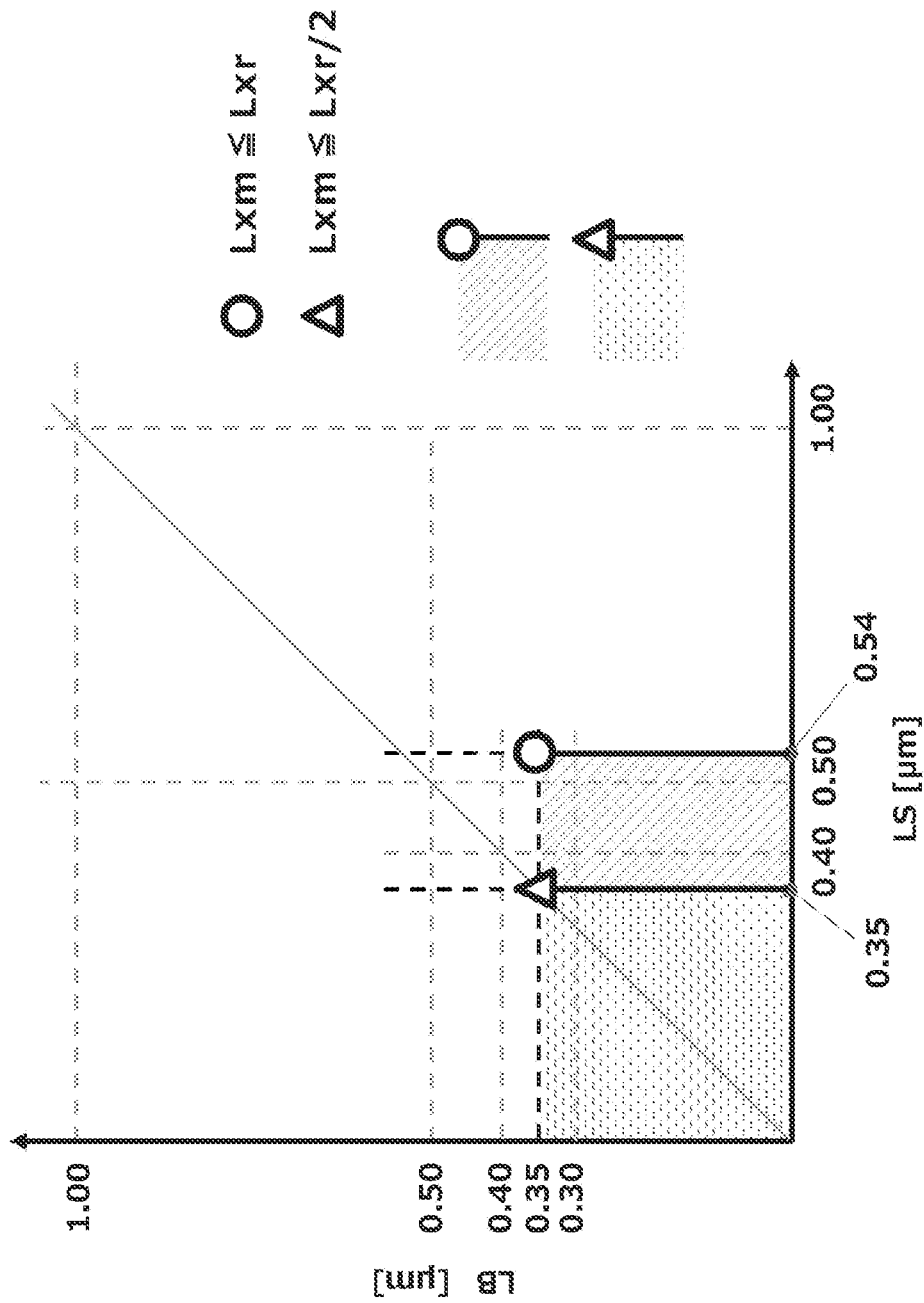

SEMICONDUCTOR DEVICE

CROSS REFERENCE TO RELATED APPLICATION

This is a continuation application of PCT Patent Application No. PCT/JP2021/034220 filed on Sep. 17, 2021, designating the United States of America. The entire disclosure of the above-identified application, including the specification, drawings and claims is incorporated herein by reference in its entirety.

FIELD

The present disclosure relates to semiconductor devices, and particularly relates to semiconductor devices of chip-size package type.

BACKGROUND

Conventional vertical field effect transistors are disclosed, for example, by the following: Patent Literature (PTL) 1 discloses a vertical field effect transistor having a structure of orthogonal type and shows that the orthogonal structure is effective for reducing on-resistance; and PTL 2 discloses a vertical field effect transistor having a structure of parallel type and shows that the parallel structure is effective for improving tolerance at turn-off.

CITATION LIST

Patent Literature

PTL 1: Japanese Patent No. 3999225
PTL 2: U.S. Pat. No. 5,366,914, the Specification

SUMMARY

Technical Problem

Unfortunately, the orthogonal structure disclosed in PTL 1 has features specialized in reducing on-resistance, and it is therefore difficult to improve tolerance at turn-off. In contrast, the parallel structure disclosed in PTL 2 has features specialized in improving tolerance at turn-off, and it is therefore difficult to reduce on-resistance. Accordingly, it is difficult to improve both properties together. In other words, the conventional vertical field effect transistors have a trade-off between the reduction of on-resistance and the improvement of tolerance at turn-off.

In view of this, it is required, in a vertical field effect transistor, to reduce on-resistance and also improve tolerance at turn-off to prevent a breakdown caused by a parasitic bipolar transistor being turned ON at turn-off.

Solution to Problem

In order to solve problems as described above, a semiconductor device according to the present disclosure is a semiconductor device of chip-size package type that is face-down mountable and includes: a semiconductor substrate that comprises silicon and contains an impurity of a first conductivity type; a low-concentration impurity layer on and in contact with the semiconductor substrate, the low-concentration impurity layer containing an impurity of the first conductivity type having a concentration lower than a concentration of the impurity of the first conductivity type in the semiconductor substrate; and a vertical field effect transistor. The vertical field effect transistor includes: a body region of a second conductivity type in a surface of the low-concentration impurity layer, the second conductivity type being different from the first conductivity type; source regions of the first conductivity type in a surface of the body region; a source electrode electrically connected to the source regions; a plurality of trenches extending in a first direction parallel to a top surface of the semiconductor substrate and aligned at regular intervals in a second direction orthogonal to the first direction, each of the plurality of trenches having a depth penetrating the body region from a top surface of the low-concentration impurity layer and not reaching a bottom of the low-concentration impurity layer; gate insulating films, each of which covers at least a portion of a surface of a corresponding trench among the plurality of trenches; gate conductors, each of which is disposed on a corresponding gate insulating film among the gate insulating films; and connection portions that electrically connect the body region and the source electrode. The source regions and the connection portions are alternately and cyclically disposed in the first direction in the vertical field effect transistor. $Lxm \leq Lxr \leq 0.20$ µm holds true where Lxm [µm] denotes a trench-to-trench distance between adjacent trenches that are adjacent to each other in the second direction among the plurality of trenches, and Lxr [µm] denotes an inner width of one trench among the plurality of trenches. The following formulas hold true: $LB<0.35$ µm; and $LS \leq 0.12 \times Vss \times Lxm - 0.76 \times Lxm - 0.05 \times Vss + 1.26$ [µm], where LB [µm] denotes a length, in the first direction, of one connection portion among the connection portions, LS [µm] denotes a length, in the first direction, of one source region among the source regions, and Vss [V] denotes a maximum specification voltage of the vertical field effect transistor.

Advantageous Effects

The present disclosure provides a semiconductor device that can achieve both the reduction of on-resistance and the improvement of tolerance at turn-off. In other words, it is possible to achieve both the reduction of on-resistance and the improvement of tolerance at turn-off, thereby easily implementing a circuit specification for circuits with high withstand voltage and low resistance which has been demanded in recent years.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 5A-1 illustrates a structure of the first transistor according to Embodiment 1 used for simulating current density at the time of driving the first transistor.

FIG. 5A-2 illustrates the result of the simulation of the current density at the time of driving the first transistor according to Embodiment 1.

FIG. 5A-3 illustrates what results from overlapping FIG. 5A-1 and FIG. 5A-2.

FIG. 5B-1 illustrates a structure of the first transistor according to Embodiment 1 used for simulating current density at the time of driving the first transistor.

FIG. 5B-2 illustrates the result of the simulation of the current density at the time of driving the first transistor according to Embodiment 1.

FIG. 5B-3 illustrates what results from overlapping FIG. 5B-1 and FIG. 5B-2.

FIG. 8 illustrates a chart showing examples of on-resistance indicated in the specification of the first transistor according to Embodiment 1.

FIG. 10 illustrates a graph showing an example of the relationship between the length of a source region and the length of a connection portion in the first direction, which is required for obtaining the advantageous effects of the present disclosure, according to Embodiment 1.

DESCRIPTION OF EMBODIMENTS

Embodiment 1

[1. Structure of Semiconductor Device]

Hereinafter, the orthogonal structure of a vertical field effect transistor according to the present disclosure will be described using a dual structure as an example. The dual structure is not essential for the vertical field effect transistor and the vertical field effect transistor may have a single structure, a triple structure, or a structure including more than three transistors.

Figure 1:
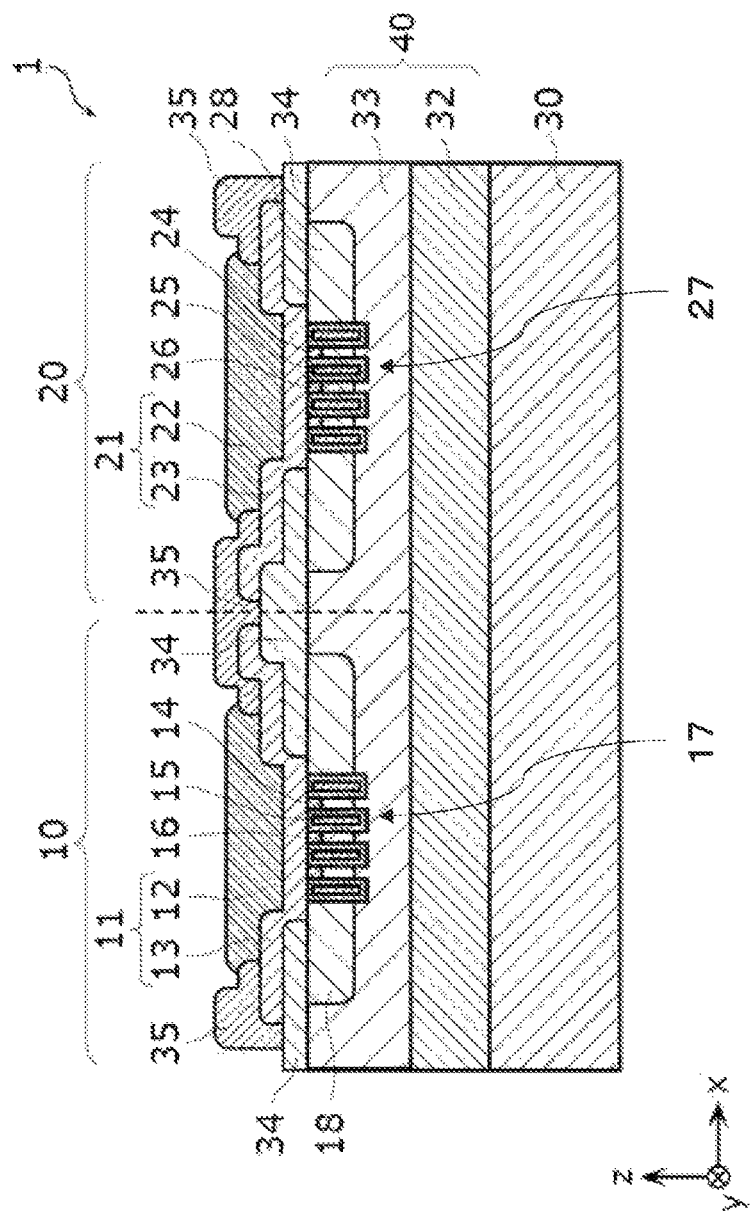
FIG. 1 is a schematic cross-sectional view of an example of the structure of a semiconductor device according to Embodiment 1.
Figure 2A:
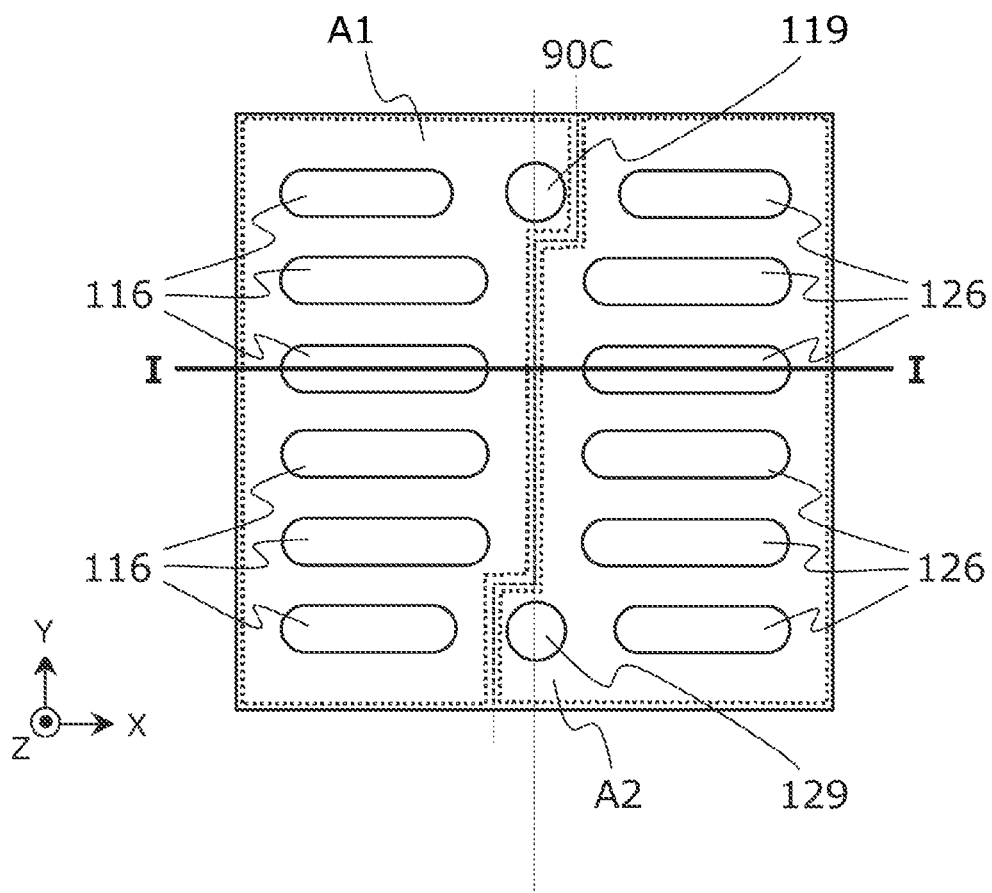
FIG. 2A is a schematic plan view of an example of the structure of the semiconductor device according to Embodiment 1.
Figure 2B:
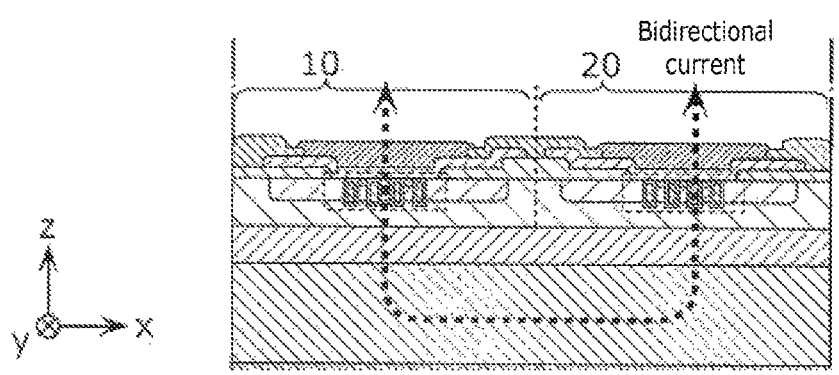
FIG. 2B is a schematic cross-sectional view of a main current flowing through the semiconductor device according to Embodiment 1.

FIG. 1 is a cross-sectional view of an example of the structure of semiconductor device 1. FIG. 2A is a plan view of an example of the structure of semiconductor device 1, and the size and shape of semiconductor device 1 and the arrangement of electrode pads are examples. FIG. 2B is a cross-sectional view schematically illustrating a main current flowing through semiconductor device 1. FIG. 1 and FIG. 2B each illustrate a cross section taken along line I-I in FIG. 2A.

As illustrated in FIG. 1 and FIG. 2A, semiconductor device 1 includes semiconductor layer 40, metal layer 30, first vertical field effect transistor 10 (hereinafter also referred to as "transistor 10") formed in first region A1 of semiconductor layer 40, and second vertical field effect transistor 20 (hereinafter also referred to as "transistor 20") formed in second region A2 of semiconductor layer 40. First region A1 and second region A2 are adjacent to each other in the plan view (i.e., top view) of semiconductor layer 40, as illustrated in FIG. 2A. Virtual boundary 90C between first region A1 and second region A2 is indicated by a dashed line in FIG. 2A.

Semiconductor layer 40 is formed by stacking semiconductor substrate 32 and low-concentration impurity layer 33. Semiconductor substrate 32 is disposed on the rear surface side of semiconductor layer 40 and comprises silicon containing an impurity of a first conductivity type. Low-concentration impurity layer 33 is disposed on the surface side of semiconductor layer 40, formed in contact with semiconductor substrate 32, and contains a first conductivity type impurity having a lower concentration than the first conductivity type impurity in semiconductor substrate 32. Low-concentration impurity layer 33 may be formed on semiconductor substrate 32 by, for example, epitaxial growth. Note that low-concentration impurity layer 33 is also the drift layer of transistor 10 and transistor 20, and may be referred to as a drift layer in the present specification.

Metal layer 30 is formed in contact with the rear surface of semiconductor layer 40 and comprises silver (Ag) or copper (Cu). Note that metal layer 30 may comprise a slight amount of element other than metals which gets mixed in as an impurity in the process of manufacturing metal materials. Moreover, metal layer 30 may or may not be formed in contact with the entire rear surface of semiconductor layer 40.

As illustrated in FIG. 1 and FIG. 2A, first body region 18 containing an impurity of a second conductivity type different from the first conductivity type is formed in first region A1 of low-concentration impurity layer 33. First source regions 14 containing the first conductivity type impurity, first gate conductors 15, and first gate insulating films 16 are formed in first body region 18. Each of first gate conductors 15 and each of first gate insulating films 16 are formed inside a corresponding one of first trenches 17 extending in a first direction (Y-axis direction) parallel to the top surface of semiconductor substrate 32 and aligned at regular intervals in a second direction (X direction) orthogonal to the first direction (Y direction). Each of first trenches 17 has a depth penetrating first body region 18 from the top surface of semiconductor layer 40 and not reaching the bottom of low-concentration impurity layer 33. First source electrode 11 is composed of portion 12 and portion 13, and portion 12 is connected to first source region 14 and first body region 18 via portion 13. Each of first gate conductors 15 is an embedded gate electrode embedded in semiconductor layer 40, and is electrically connected to first gate electrode pad 119.

Portion 12 of first source electrode 11 is a layer to be bonded to solder in a reflow process during face-down mounting. In one non-limiting example, portion 12 may comprise a metal material including at least one of nickel, titanium, tungsten, and palladium. The surface of portion 12 may be plated with, for instance, gold.

Portion 13 of first source electrode 11 is a layer that connects portion 12 and semiconductor layer 40. In one non-limiting example, portion 13 may comprise a metal material including at least one of aluminum, copper, gold, and silver.

Second body region 28 containing the second conductivity type impurity is formed in second region A2 of low-concentration impurity layer 33. Second source regions 24 containing the first conductivity type impurity, second gate conductors 25, and second gate insulating films 26 are formed in second body region 28. Each of second gate conductors 25 and each of second gate insulating films 26 are formed inside a corresponding one of second trenches 27. Each of second trenches has a depth penetrating second body region 28 from the top surface of semiconductor layer 40 and not reaching the bottom of low-concentration impurity layer 33. Second source electrode 21 is composed of portion 22 and portion 23, and portion 22 is connected to second source region 24 and second body region 28 via portion 23. Each of second gate conductors 25 is an embedded gate electrode embedded in semiconductor layer 40, and is electrically connected to second gate electrode pad 129.

Portion 22 of second source electrode 21 is a layer to be bonded to solder in a reflow process during face-down mounting. In one non-limiting example, portion 22 may comprise a metal material including at least one of nickel, titanium, tungsten, and palladium. The surface of portion 22 may be plated with, for instance, gold.

Portion 23 of second source electrode 21 is a layer that connects portion 22 and semiconductor layer 40. In one non-limiting example, portion 23 may comprise a metal material including at least one of aluminum, copper, gold, and silver.

With the configurations of transistor 10 and transistor 20 described above, semiconductor substrate 32 functions as a common drain region serving as both the first drain region of transistor 10 and the second drain region of transistor 20. A portion of low-concentration impurity layer 33 on the side connected to semiconductor substrate 32 may also function as the common drain region. Metal layer 30 functions as a common drain electrode serving as both the drain electrode of transistor 10 and the drain electrode of transistor 20.

As illustrated in FIG. 1, first body region 18 is covered with interlayer insulating layer 34 having an opening, and portion 13 of first source electrode 11, which is connected to first source region 14 via the opening of interlayer insulating layer 34, is provided. Interlayer insulating layer 34 and portion 13 of first source electrode 11 are covered with passivation layer 35 having an opening, and portion 12 which is connected to portion 13 of first source electrode 11 via the opening of passivation layer 35 is provided.

Second body region 28 is covered with interlayer insulating layer 34 having an opening, and portion 23 of second source electrode 21, which is connected to second source region 24 via the opening of interlayer insulating layer 34, is provided. Interlayer insulating layer 34 and portion 23 of second source electrode 21 are covered with passivation layer 35 having an opening, and portion 22 which is connected to portion 23 of second source electrode 21 via the opening of passivation layer 35 is provided.

Accordingly, first source electrode pads 116 and second source electrode pads 126 are regions where first source electrodes 11 and second source electrodes 21 are partly exposed on the surface of semiconductor device 1, respectively, and are so-called terminal portions. Similarly, at least one first gate electrode pad 119 and at least one second gate electrode pad 129 are regions where first gate electrode 19 (not illustrated in FIG. 1, FIG. 2A, and FIG. 2B) and second gate electrode 29 (not illustrated in FIG. 1, FIG. 2A, and FIG. 2B) are partly exposed on the surface of semiconductor device 1, respectively, and are so-called terminal portions.

Assuming, for example, that the first conductivity type is n type and the second conductivity type is p type in semiconductor device 1, first source region 14, second source region 24, semiconductor substrate 32, and low-concentration impurity layer 33 may comprise an n-type semiconductor, and first body region 18 and second body region 28 may comprise a p-type semiconductor.

Alternatively, assuming, for example, that the first conductivity type is p type and the second conductivity type is n type in semiconductor device 1, first source region 14, second source region 24, semiconductor substrate 32, and low-concentration impurity layer 33 may comprise a p-type semiconductor, and first body region 18 and second body region 28 may comprise an n-type semiconductor.

The following description describes the conduction operation of semiconductor device 1 in the case where transistor 10 and transistor 20 are so-called n-channel transistors where the first conductivity type is n type and the second conductivity type is p type.

Note that transistor 10 and transistor 20 are described herein under the precondition that transistor 10 and transistor 20 are provided with symmetry without any difference therebetween in terms of functions, characteristics, structures, etc. FIG. 1, FIG. 2A, and FIG. 2B each illustrate transistor 10 and transistor 20 with the precondition of symmetry, but symmetry is not necessarily a required condition for the vertical field effect transistor of chip-size package type having a dual structure according to the present disclosure.

[2. Orthogonal Structure]

Figure 3A:
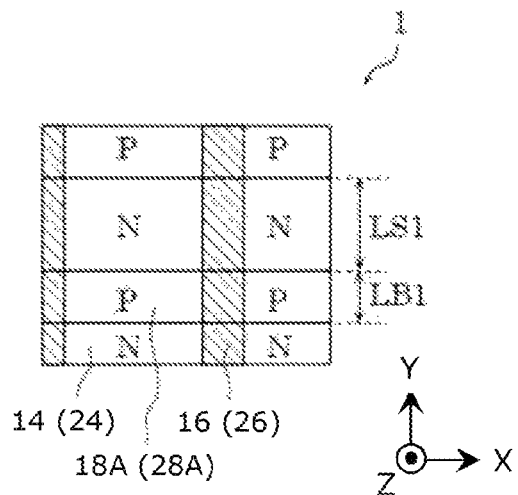
FIG. 3A is a schematic plan view of the configuration of an approximate single unit of a first transistor according to Embodiment 1.
Figure 3B:
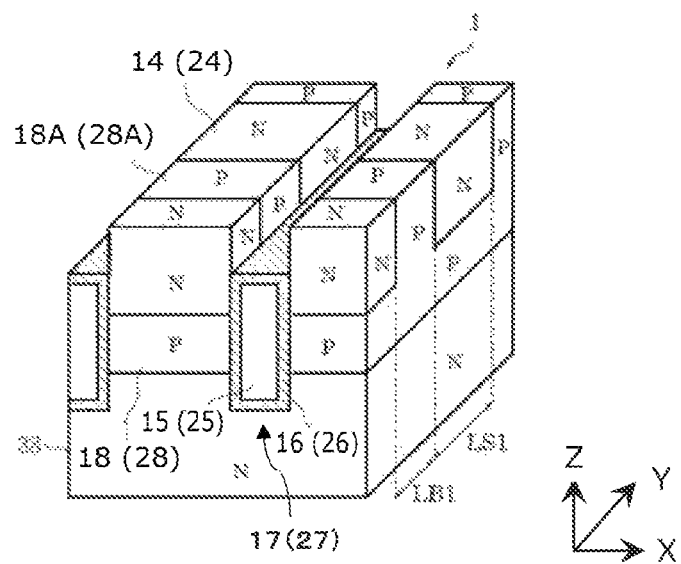
FIG. 3B is a schematic perspective view of the configuration of an approximate single unit of the first transistor according to Embodiment 1.

FIG. 3A is a plan view and FIG. 3B is a perspective view of the configuration of an approximate single unit of transistor 10 (or transistor 20) which is repeatedly formed in the X direction and the Y direction of semiconductor device 1. For the sake of easy understanding, semiconductor substrate 32 and first source electrode 11 (or second source electrode 21) are not illustrated in FIG. 3A and FIG. 3B. Note that the Y direction is a direction (the first direction) parallel to the top surface of semiconductor layer 40 and in which first trenches 17 and second trenches 27 extend. The X direction is a direction (the second direction) parallel to the top surface of semiconductor layer 40 and orthogonal to the Y direction.

As illustrated in FIG. 3A and FIG. 3B, transistor 10 is provided with first connection portions 18A that electrically connect first body region 18 and first source electrode 11. First connection portions 18A are regions, in first body region 18, where first source regions 14 are not formed, and contain the same second conductivity type impurity as first body region 18. First source regions 14 and first connection portions 18A are repeatedly disposed, both alternately and cyclically, along the Y direction. The same applies to transistor 20.

In semiconductor device 1, when a high voltage is applied to first source electrodes 11, a low voltage is applied to second source electrodes 21, and a voltage higher than or equal to a threshold is applied to second gate electrode 29 (second gate conductors 25) with the voltage of second source electrodes 21 serving as a reference, a conducting channel is formed in the vicinity of second gate insulating film 26 in second body region 28. As a result, a main current flows along a path from first source electrodes 11 to first connection portions 18A to first body region 18 to low-concentration impurity layer 33 to semiconductor substrate 32 to metal layer 30 to semiconductor substrate 32 to low-concentration impurity layer 33 to the conducting channel formed in second body region 28 to second source regions 24 and to second source electrodes 21, thereby placing semiconductor device 1 in a conductive state. Note that the interface between second body region 28 and low-concentration impurity layer 33 in this conduction path includes a PN junction and serves as a body diode. Since the main current flows through metal layer 30, increasing the thickness of metal layer 30 expands the cross-sectional area of the main current path, and the on-resistance of semiconductor device 1 can be reduced.

Similarly, in semiconductor device 1, when a high voltage is applied to second source electrodes 21, a low voltage is applied to first source electrodes 11, and a voltage higher than or equal to a threshold is applied to first gate electrode 19 (first gate conductors 15) with the voltage of first source electrodes 11 serving as a reference, a conducting channel is formed in the vicinity of first gate insulating film 16 in first body region 18. As a result, a main current flows along a path from second source electrodes 21 to second connection portions 28A to second body region 28 to low-concentration impurity layer 33 to semiconductor substrate 32 to metal layer 30 to semiconductor substrate 32 to low-concentration impurity layer 33 to the conducting channel formed in first body region 18 to first source regions 14 and to first source electrodes 11, thereby placing semiconductor device 1 in a conductive state. Note that the interface between first body region 18 and low-concentration impurity layer 33 in this conduction path includes a PN junction and serves as a body diode.

Hereinafter, the length of first source region 14 in the Y direction is referred to as LS1 and the length of second source region 24 in the Y direction is referred to as LS2. In the case of not discriminating between the length of first source region 14 and the length of second source region 24, the length of a source region is referred to as LS. The length of first connection portion 18A in the Y direction is referred to as LB1 and the length of second connection portion 28A in the Y direction is referred to as LB2. In the case of not discriminating between the length of first connection portion 18A in the Y direction and the length of second connection portion 28A in the Y direction, the length of a connection portion is referred to as LB.

It may be roughly understood that a vertical field effect transistor having a single structure is to be formed using only one side (transistor 10) of vertical field effect transistors having a dual structure. In a vertical field effect transistor of chip-size package type, however, a drain electrode pad needs to be additionally provided on the surface of semiconductor layer 40 where first source electrode pads 116 and first gate electrode pad 119 are provided. In this case, it is necessary to form in advance, from the surface side of semiconductor layer 40, a drain lead-out structure to be electrically connected to a drain layer provided on the rear surface side of semiconductor layer 40.

[3. Base Resistance in Orthogonal Structure]

Transistor 10 (or transistor 20) is structurally provided with a parasitic bipolar transistor. A parasitic bipolar transistor easily turns ON when a semiconductor device that has been driving is turned OFF (at turn-off), and the greater a driving voltage immediately before the turn-off of the semiconductor device is, the more easily the parasitic bipolar transistor turns ON. The maximum driving voltage among driving voltages that do not turn ON the parasitic bipolar transistor when semiconductor device 1 is turned OFF is called "withstand voltage at turn-off (Voff)" in the present application. For example, when it turns out that the parasitic bipolar transistor turns ON when the semiconductor device that has been driven with 11 V is turned OFF, and does not turn ON when the semiconductor device that has been driven with 10 V is turned OFF, the withstand voltage at turn-off (Voff) of the semiconductor device is greater than or equal to 10 V and less than 11 V. Note that in the case where semiconductor device 1 is an n-type vertical field effect transistor having a dual structure, a driving voltage is a source-source voltage (VSS), and in the case where semiconductor device 1 is an n-type vertical field effect transistor having a single structure, a driving voltage is a drain-source voltage (VDS). In the case where semiconductor device 1 is a p-type vertical field effect transistor having a dual structure, a driving voltage is a drain-drain voltage (VDD). Driving means a state in which a voltage is applied to gate conductors and current is conducted between sources (or between a drain and a source or between drains), and the conduction is made under conditions for a linear region unless otherwise stated.

Semiconductor device 1 is required to have the withstand voltage at turn-off (Voff) of at least a source-source maximum specification voltage (or a drain-source maximum specification voltage or a drain-drain maximum specification voltage, or also referred to as a maximum specification voltage without discriminating among these maximum specification voltages). Note that the maximum specification voltage is the maximum rated voltage defined in the product specification of the transistor. Whether a parasitic bipolar transistor easily turns ON is related to base resistance $Rb$ [Ω] of the parasitic bipolar transistor. Base resistance $Rb1$ [Ω] is an impedance (hereinafter also referred to as first impedance) which is, in a path between first connection portion 18A and first body region 18, inclusive, the maximum impedance seen by first source electrode 11. Base resistance $Rb2$ [Ω] is an impedance (hereinafter also referred to as second impedance) which is, in a path between second connection portion 28A and second body region 28, inclusive, the maximum impedance seen by second source electrode 21.

Base resistance Rb1 of transistor 10 is expressed by Rb1=ρ×LS1/Lxm/Lch and base resistance Rb2 of transistor 20 is expressed by Rb2=ρ×LS2/Lxm/Lch, where ρ [Ω*μm] denotes the sheet resistivity ratio of first body region 18 (or second body region 28), Lxm [μm] denotes trench-to-trench distance, and Lch [μm] denotes the distance from the bottom of first source region 14 (or second source region 24) to the boundary between first body region 18 (or second body region 28) and low-concentration impurity layer 33 (a conducting channel length).

At the turn-off of transistor 10, carriers stored in the vicinity of first gate insulating films 16 pass through first body region 18 and first connection portions 18A and are instantaneously dispersed toward first source electrodes 11. If base resistance Rb1 is high, a voltage drop caused by the passing of the carriers also gets larger. The voltage therefore easily drops below a threshold with which the parasitic bipolar transistor turns ON. The same applies to transistor 20. Accordingly, it is necessary to reduce Rb1 and Rb2 in order to increase the withstand voltage at turn-off (Voff) of semiconductor device 1.

If trench-to-trench distance Lxm is made shorter, it is possible to provide one or more additional trenches in the resulting surplus amount of area, thereby reducing on-resistance while keeping the area of semiconductor device 1 to be same. This is a measure to increase the numbers of trenches and gate conductors (an increase in trench density) to increase the total gate width of semiconductor device 1. If trench-to-trench distance Lxm is made shorter, however, a problem that the withstand voltage at turn-off (Voff) of semiconductor device 1 decreases due to an increase in Rb occurs, as described above.

Assuming that sheet resistivity ratio ρ is invariable, it is conceivable, from the expressions described above, to adjust other parameters instead of sheet resistivity ratio p, either to shorten LS or lengthen Lch so that Rb does not increase. Either way, however, changes on-resistance to increase, and this cancels the effect of on-resistance reduction produced by reducing trench-to-trench distance Lxm. Due to such a relationship, it is difficult to achieve both the reduction of on-resistance and the improvement of tolerance at turn-off.

Lxm and Lxr, which are to be described later in Embodiment 3, are defined by the location of the bottom of first source region 14 in the Z direction (the depth direction of semiconductor device 1). To be precise, Lxm and Lxr should be denoted as Lxmb [μm] and Lxrb [μm] based on the definitions according to the present application, but are denoted as Lxm and Lxr in Embodiment 1 for the sake of simplification.

[4. Conduction Contribution of Body Region at the Time of Driving]

The inventors have found that the reduction of on-resistance and the improvement of tolerance at turn-off are both achieved by causing first body regions 18 directly below first connection portions 18A to effectively contribute to conduction at the time of driving transistor 10. The details will be described with reference to FIG. 4A to FIG. 4F and FIG. 5A-1 to FIG. 5B-3.

Figure 4A:
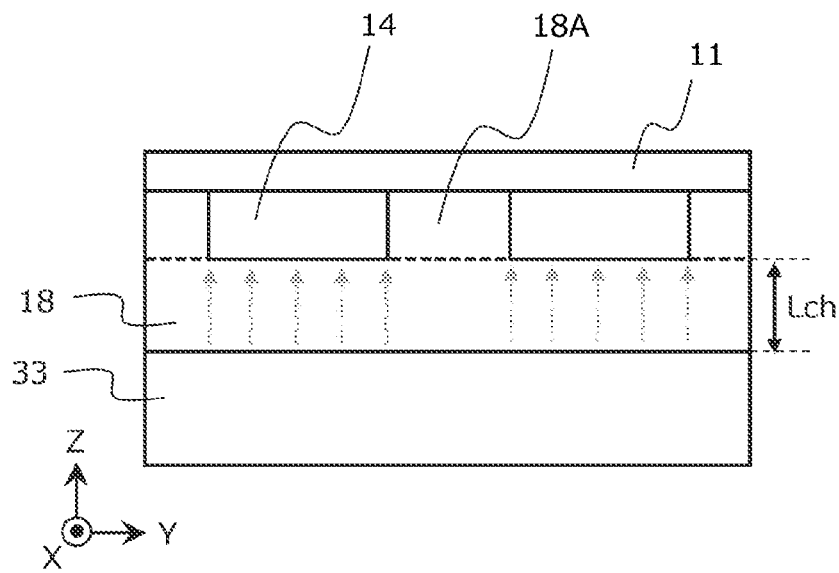
FIG. 4A is a schematic cross-sectional view of an example of the structure of the first transistor according to Embodiment 1.
Figure 4B:
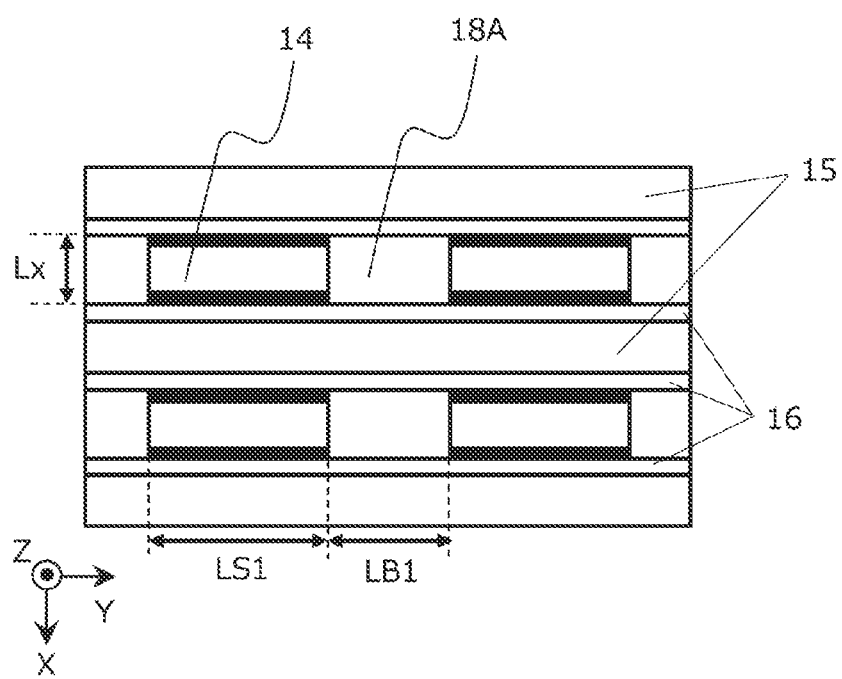
FIG. 4B is a schematic plan view of an example of the structure of the first transistor according to Embodiment 1.
Figure 4C:
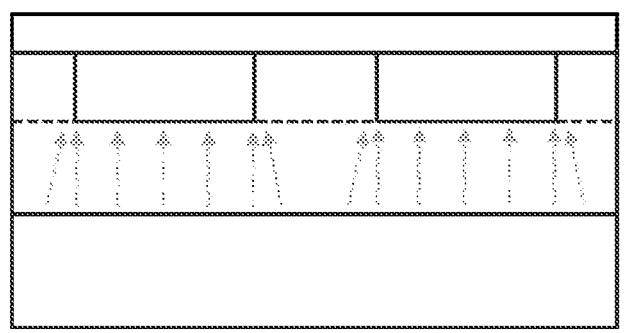
FIG. 4C is a schematic cross-sectional view of an example of the structure of the first transistor according to Embodiment
Figure 4D:
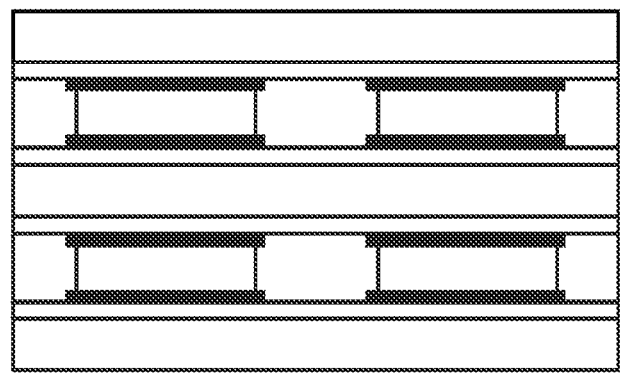
FIG. 4D is a schematic plan view of an example of the structure of the first transistor according to Embodiment 1.
Figure 4E:
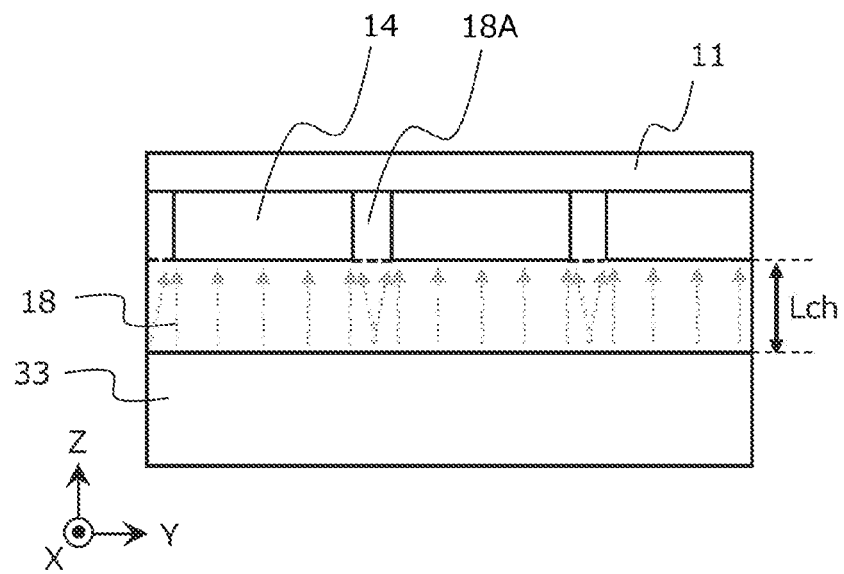
FIG. 4E is a schematic cross-sectional view of an example of the structure of the first transistor according to Embodiment
Figure 4F:
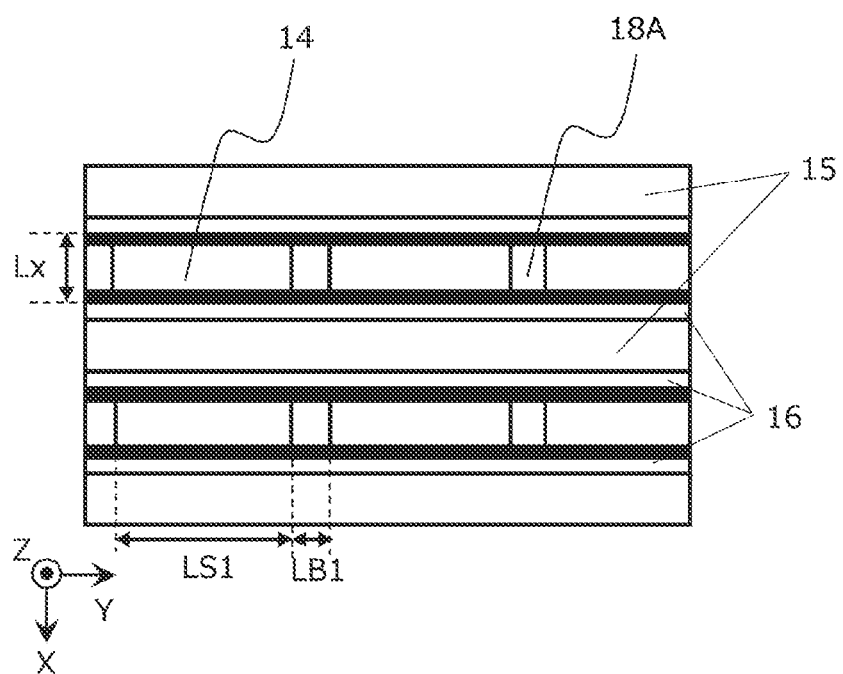
FIG. 4F is a schematic plan view of an example of the structure of the first transistor according to Embodiment 1.

FIG. 4A, FIG. 4C, and FIG. 4E are each a schematic diagram illustrating a cross section, taken along the Y direction, of the vicinity of first trench 17 at the time of driving transistor 10. FIG. 4B, FIG. 4D, and FIG. 4F are each a plan view of transistor 10 from which first source electrodes 11, interlayer insulating layer 34, and passivation layer 35 are omitted. Assuming that VGS [V] denotes an applied voltage to first gate conductors 15 (a gate-source applied voltage) when the potential of first source electrodes 11 is used as a reference, FIG. 4A schematically presents a conduction state when VGS is small. The value of VGS, however, exceeds a threshold since transistor 10 is in a conductive state. The arrows in dotted lines in the figure schematically present the flow of current passing through an inversion layer, as a conducting channel, which is generated in first body region 18. When presented in the plan view of semiconductor layer 40, the current flows like the thick lines in FIG. 4B. Only portions of the inversion layer that are generated directly below first source regions 14 along first trench 17 contribute to conduction as the conducting channel.

Since first connection portions 18A, not first source regions 14, are located directly above portions of the inversion layer which are formed in first body region 18 directly below first connection portions 18A in the vicinity of first trench 17, these portions of the inversion layer do not connect a drain region (low-concentration impurity layer 33) and first source regions 14 in the Z direction, and thus do not constitute the conducting channel. And yet only portions of the inversion layer which are very close to first source regions 14 in the Y direction diagonally connect the drain region (low-concentration impurity layer 33) and first source regions 14, and thus can contribute to conduction. A region that contributes to conduction (i.e., a conduction region) enlarges along the Y direction as VGS increases. FIG. 4C and FIG. 4D are schematic diagrams illustrating the case where VGS is high, and the diagonal arrows in dotted lines in FIG. 4C each present an enlarged part of the conduction region. FIG. 4D shows how the enlargement of each of conduction regions looks like in a plan view. In other words, each of the conduction regions enlarges in both directions along the Y direction to be slightly longer than the length of a corresponding first source region 14.

If length LB1 of each of first connection portions 18A in the Y direction is made shorter when VGS is high, first source regions 14 on the both sides of first connection portion 18A approach each other. Accordingly, a proportion of a region contributable to conduction in the inversion layer formed in first body region 18 directly below first connection portion 18A gradually increases at both ends, and at a certain point, contributable regions join together and the entire length of a joined region becomes effectively contributable as the conducting channel. How this happens is schematically presented in FIG. 4E and FIG. 4F. If the entire length of first body region 18 along first trench 17 including the length of first body region 18 directly below each of first connection portions 18A can be made contributable to conduction, such a state is extremely useful for reducing on-resistance. This is an effect obtained by shortening the lengths of first connection portions 18A, and is not an effect produced for relatively increasing the lengths of first source regions 14.

Figures 1, 5A:
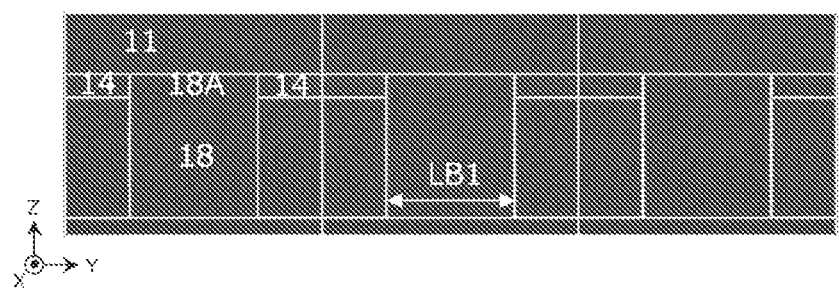
Figures 2, 5A:
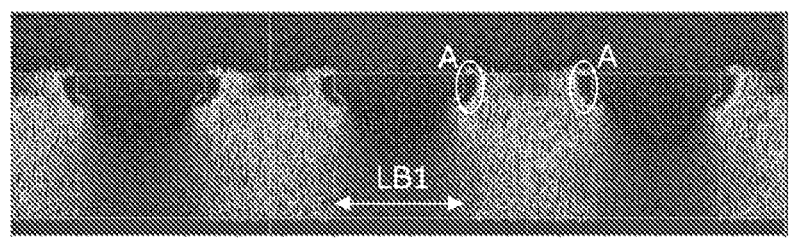
Figures 3, 5A:
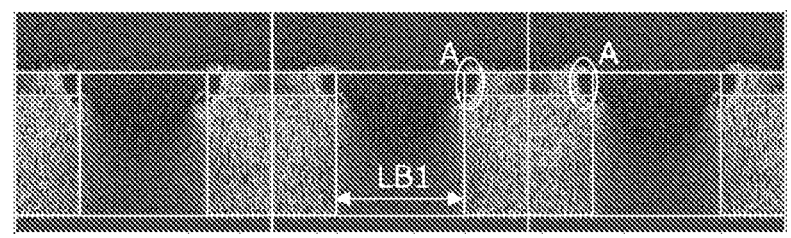
Figures 1, 5B:
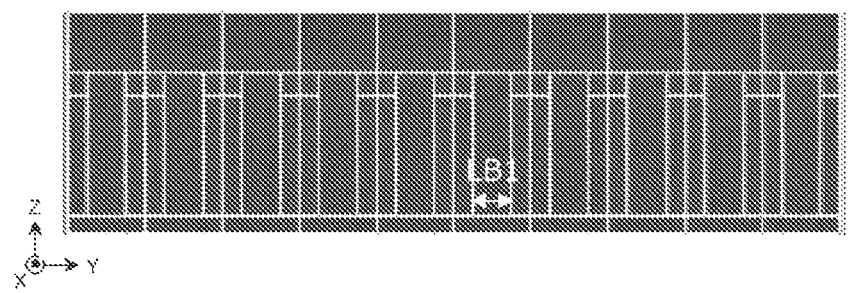
Figures 2, 5B:
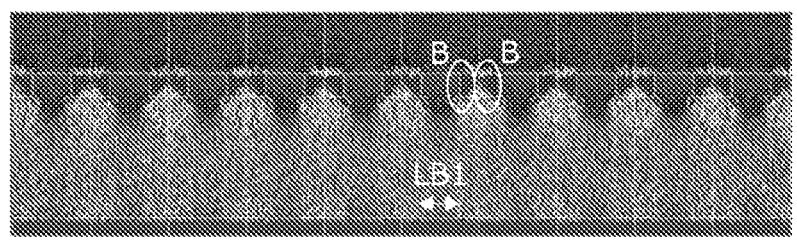
Figures 3, 5B:
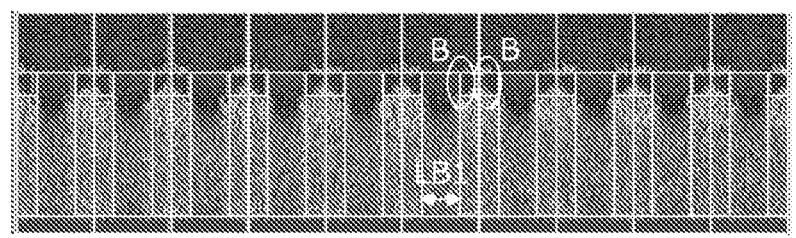

The results of simulating how first body region 18 directly below each of first connection portions 18A contributes to conduction are shown in FIG. 5A-1 to FIG. 5A-3 (hereinafter simply referred to as "FIG. 5A") and FIG. 5B-1 to FIG. 5B-3 (hereinafter simply referred to as "FIG. 5B"). FIG. 5A and FIG. 5B each illustrate a cross section, taken along the Y direction, of the vicinity of first trench 17 of transistor 10, as is the case of FIG. 4A, FIG. 4C, or FIG. 4E. The upper stages (FIG. 5A-1 and FIG. 5B-1) each illustrate a structure used for the simulation. First body region 18 is not to be sectioned into first body regions 18 directly below first source regions 14 and first body regions 18 directly below first connection portions 18A, but boundary lines are provided herein for convenience. The intermediate stages (FIG.

5A-2 and FIG. 5B-2) each illustrate, using different shades, current density when conduction is made under the condition that VGS is high. The lower stages (FIG. 5A-3 and FIG. 5B-3) each illustrate what results from overlapping a corresponding one of the upper stages and a corresponding one of the intermediate stages: FIG. 5A-3 shows what results from overlapping FIG. 5A-1 and FIG. 5A-2; and FIG. 5B-3 shows what results from overlapping FIG. 5B-1 and FIG. 5B-2.

Although the same value is used for VGS in both cases of FIG. 5A and FIG. 5B, length LB1 (each of the horizontal two-headed arrows in FIG. 5A) of each of first connection portions 18A is long in the structure illustrated in FIG. 5A. Accordingly, the contribution of first body region 18 directly under first connection portions 18A to conduction can be hardly seen. And yet parts where current density becomes finite can be slightly seen in the vicinity of first source regions 14. Furthermore, a part where current density gets high can be observed at each of both ends of each of first source regions 14 in the Y direction, as indicated by circles A in FIG. 5A-2 and FIG. 5A-3. This shows the presence of current that has passed through first body region 18 directly below first connection portions 18A.

In contrast, as can be seen from FIG. 5B, since length LB1 (each of the horizontal two-headed arrows in FIG. 5B) of each of first connection portions 18A is short in the structure illustrated in FIG. 5B, the current density of most of the portions in first body region 18 directly below first connection portions 18A is almost as high as the current density of first body region 18 directly below first source regions 14. This is because since length LB1 of each of first connection portions 18A is short, that is, because first source regions 14 on the both sides of each first connection portion 18A approach each other, conducting channels that are separate join together so that the entire length of first body region 18 along first trench 17 becomes contributable to conduction. Note that it is possible to observe also in FIG. 5B that since current that has passed through first body region 18 directly below first connection portions 18A flows intensively at both ends of each of first source regions 14 in the Y direction which are indicated by circles B, current density gets very high at these ends.

Figure 6:
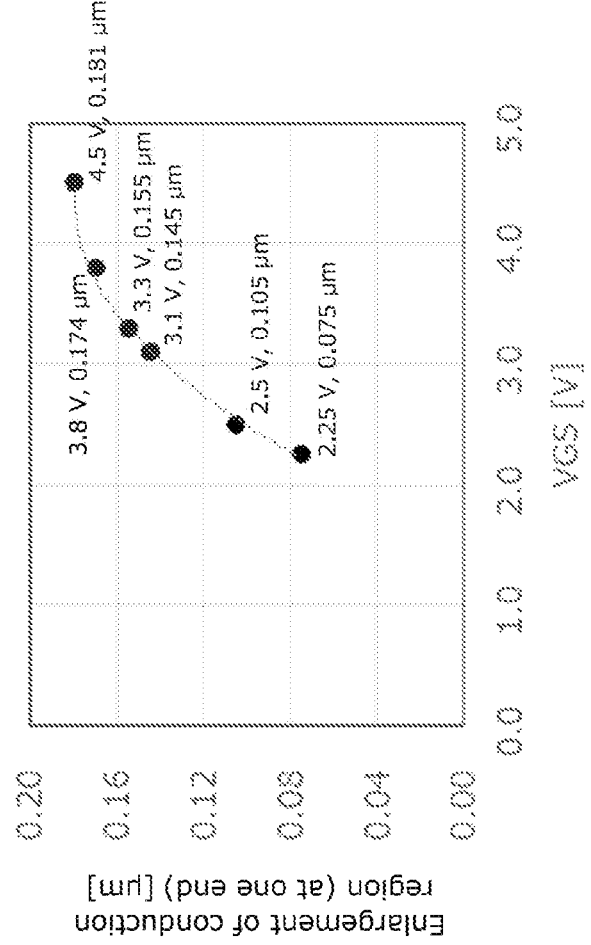
FIG. 6 illustrates a graph showing the relationship between the enlargement of a conduction region from a source region and an applied voltage to gate conductors at the time of driving.

FIG. 6 is a graph showing examples of calculating the VGS dependency of the length, in the Y direction, of a conduction region that enlarges from first source region 14 toward first body region 18 directly below first connection portion 18A. The calculation is performed by the inventors using a calculation model, for which adjustment is made for approximation to measured values, for an n-type vertical field effect transistor having a dual structure. The dual structure is of the orthogonal type illustrated in FIG. 1, FIG. 3A, and FIG. 3B, and prescribed values are uniformly used for the size (3.40 mm×1.96 mm) of a semiconductor device, the inner width (Lxr=0.20 µm) of a single trench, and other parameters. A length, in the Y direction, at one end of a conduction region that enlarges from one first source region 14 is plotted along the vertical axis in the graph.

As can be seen from FIG. 6, the length of an enlarging conduction region increases as VGS increases. According to FIG. 6, a conduction region enlarges at its one end by 0.174 µm when VGS=3.8 V, for example. Accordingly, in one first connection portion 18A sandwiched by first source regions 14 from its both sides in the Y direction, when length LB1 of first connection portion 18A is at most 0.174 µm×2=0.348 µm, the entirety, in the Y direction, of first body region 18 directly below first connection portion 18A can be made contributable to conduction. Stated differently, with LB1<0.35 µm, the entire length in the Y direction contributes to conduction under the driving condition of VGS≥3.8 V.

If the magnitude of VGS and length LB1 of each of first connection portions 18A are appropriately selected, it is possible to effectively make the entire length of first body region 18 along first trench 17 a conducting channel under desired driving conditions, thereby reducing on-resistance. This effect can be obtained by defining length LB1 of each of first connection portions 18A to be a certain length or less, and is marked by the feature that the on-resistance loses its dependency on lengths LS1 of first source regions 14. This is because owing to the entire length of first body region 18 along first trench 17 becoming an effective conducting channel, a state at the time of driving is the same regardless of whether lengths LS1 of first source regions 14 are long or short. Note that it is not possible to change only lengths LB1 of first connection portions 18A, alone, in semiconductor device 1 which uses a certain area that is finite, and shortening lengths LB1 increases lengths LS1 of first source regions 14 or the total amount of lengths LS1 of first source regions 14. A person skilled in the art normally thinks that on-resistance decreases when LS1 increases, but with the range of LS1 defined in the present disclosure, the on-resistance of transistor 10 does not decrease noticeably even in consideration of an influence made by an increase in LS1. Accordingly, the present disclosure is characterized in that even when lengths LB1 of first connection portions 18A are made much shorter, the on-resistance of transistor 10 is in a convergence region in which the on-resistance does not decrease noticeably, irrespective of lengths LS1 of first source regions 14. It is therefore possible to shorten lengths LS1 of first source regions 14 without deteriorating on-resistance. This is why it is possible to achieve also the reduction of base resistance Rb1 at the same time, which will be described later.

Chart 1 and Chart 2 below each show the results of calculating on-resistance at the time of driving with VGS=3.8 V by the inventors using the same calculation model as the calculation model used for the derivation of the calculation results shown in FIG. 6. Three levels of 0.10 µm, 0.14 µm, and 0.18 µm are set for trench-to-trench distance Lxm. Trench inner width Lxr is fixed to 0.20 µm. Note that driving with VGS=3.8 V is a condition that enables the entire length of first body region 18 along the Y direction to contribute to conduction if length LB1 of each of first connection portions 18A is less than 0.35 µm, as shown in FIG. 6.

CHART 1

| Length LS of source region: length LB of connection | Trench-to-trench distance L × m | | |
|---|---|---|---|
| portion in Y direction | 0.18 µm | 0.14 µm | 0.10 µm |
| 0.50 µm:0.50 µm | 1.87 | 1.82 | 1.77 |
| 0.50 µm:0.45 µm | 1.84 | 1.80 | 1.76 |
| 0.50 µm:0.40 µm | 1.82 | 1.78 | 1.74 |
| 0.50 µm:0.35 µm | 1.80 | 1.76 | 1.72 |
| 0.50 µm:0.30 µm | 1.79 | 1.75 | 1.71 |
| 0.50 µm:0.25 µm | 1.79 | 1.75 | 1.71 |

CHART 2

| Length LS of source region: length LB of connection portion in Y direction | Trench-to-trench distance L × m | | |
|---|---|---|---|
| | 0.18 μm | 0.14 μm | 0.10 μm |
| 0.50 μm:0.30 μm | 1.79 | 1.75 | 1.71 |
| 0.45 μm:0.30 μm | 1.79 | 1.75 | 1.71 |
| 0.40 μm:0.30 μm | 1.79 | 1.75 | 1.71 |
| 0.35 μm:0.30 μm | 1.79 | 1.75 | 1.71 |
| 0.30 μm:0.30 μm | 1.79 | 1.75 | 1.71 |

Chart 1 shows the results of on-resistance when length LS of each of source regions is fixed to 0.50 μm and length LB of each of connection portions is changed. As can be seen from Chart 1, on-resistance is high when LB is long, but decreases since the total length of LS increases as LB is made shorter. When LB<0.35 μm, however, on-resistance no longer decreases although the total length of LS increases.

Chart 2 shows the results of on-resistance when, on the contrary, length LB of each of the connection portions is fixed to 0.30 μm and length LS of each of the source regions is changed. If LS increases, the total length of LS also increases, and if LS decreases, the total length of LS also decreases. As can be seen from Chart 2, however, under the condition where length LB is fixed as LB=0.30 μm, on-resistance does not vary depending on an increase or a decrease in LS. This shows that since the entire length of first body region 18 in the Y direction can contribute to conduction already at the time of driving under the conditions of LB<0.35 μm and VGS=3.8 V, transistor 10 has come to the state in which on-resistance is no longer affected by whether LS or the total length of LS is either long or short.

Figure 7:
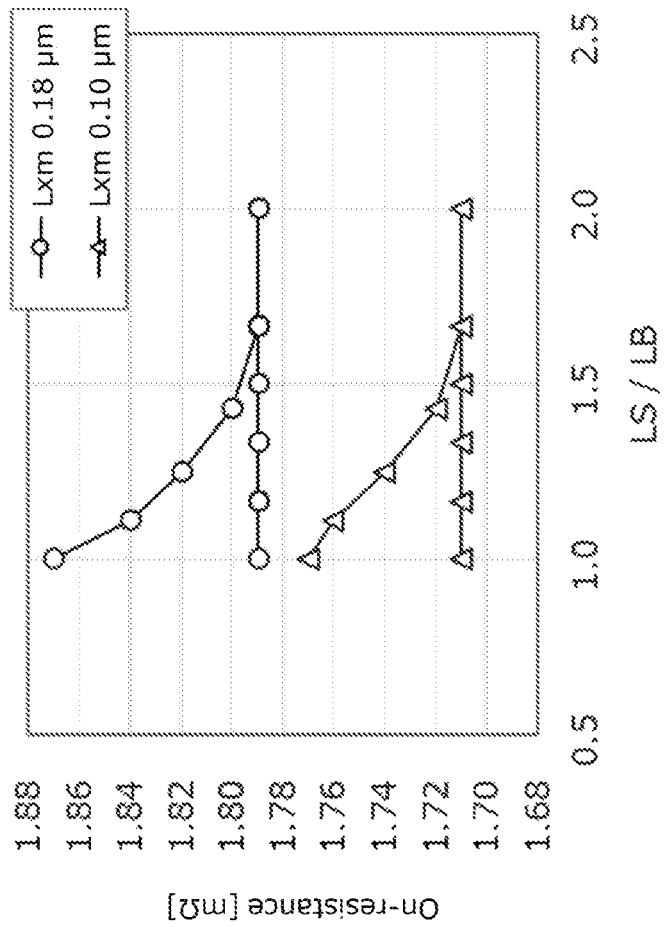
FIG. 7 illustrates a graph showing the relationship between on-resistance and a ratio of the length of a source region to the length of a connection portion.

What results from plotting the results indicated in Chart 1 and Chart 2 is shown in FIG. 7. The horizontal axis presents the ratio of LS to LB. Two levels of 0.18 μm and 0.10 μm are indicated for trench-to-trench distance Lxm. Although the absolute values of on-resistances are different between the two levels, the same tendency can be observed. In other words, the graph in FIG. 7 is composed of: a downward-sloping portion from upper left to lower right in which on-resistance decreases as LS/LB increases; and a constant portion in which on-resistance does not vary depending on the value of LS/LB. The downward-sloping portion corresponds to Chart 1 and shows the case where only LB is made shorter while LS is kept to be 0.50 μm (an increase in terms of LS/LB). The constant portion, on the other hand, corresponds to Chart 2 and shows the case where only LS is reduced while LB is kept to be 0.30 μm (a decrease in terms of LS/LB). The constant portion appears in the graph owing to the conditions of VGS=3.8 V and LB<0.35 μm, irrespective of the value of Lxm. In short, that the on-resistance of transistor 10 is in the convergence region in which the on-resistance no longer decreases noticeably even when lengths LB1 of first connection portions 18A are made much shorter, according to the present application, means that the on-resistance is in the state of losing not only dependency on lengths LB1 but also dependency on lengths LS1 of first source regions 14.

The term "the on-resistance of transistor 10" means on-resistance at the time when a voltage having a value defined in a specification is applied to first gate conductors 15 to supply a current having a value defined in the specification to transistor 10. The specification is the product specification of the transistor, and FIG. 8 shows examples of on-resistance (RSS(on) [mΩ]) indicated in the specification of an n-type vertical field effect transistor having a dual structure. In the examples in FIG. 8, VGS denotes a voltage applied to first gate conductors 15 and the specification value of the voltage is any one of 2.5 V, 3.1 V, 3.8 V, and 4.5 V, or any value within this range. The current having a specification value is source-source current IS=6.9 A.

The expression "VGS is low" means driving with VGS lower than the minimum VGS indicated in the specification. In the examples shown in FIG. 8, the expression applies to the condition of driving with VGS higher than a threshold but lower than 2.5 V. The expression "VGS is high" means driving with VGS of at least the minimum VGS indicated in the specification. In the examples shown in FIG. 8, the expression applies to the condition of driving with VGS≥2.5 V. It is conceivable that a condition actually used for transistor 10 is, in most cases, a condition that VGS is high. Note that the specification mentioned in the above description is based on the properties of transistor 10 at a room temperature (normally 25 degrees Celsius).

Accordingly, the present disclosure is characterized in that on-resistance, at the time when transistor 10 is driven using any one of VGS values indicated in the specification of transistor 10 and a current having a value indicated in the specification is conducted, is in the convergence region in which the on-resistance no longer decreases noticeably even when lengths LB1 of first connection portions 18A are made much shorter. Although Embodiment 1 presents LB<0.35 μm as a condition for making the entire length of first body region 18 in the Y direction a conducting channel, this does not necessarily limit VGS to 3.8 V. If driving with the use of any VGS value indicated in the product specification of the transistor under the condition of LB<0.35 μm exhibits the characteristics described above, it means that the advantageous effects of the invention according to the present application are obtained.

[5. Achieving Both On-Resistance Reduction and Improvement of Tolerance at Turn-Off]

With the effective use of the effects described above, even when lengths LS1 of first source regions 14 are made shorter to reduce base resistance Rb1, it is possible to effectively enlarge a conducting channel at the time of driving and thus reduce on-resistance if lengths LB1 of first connection portions 18A are made shorter to a certain extent. Accordingly, it is possible to achieve both the reduction of on-resistance and the improvement of tolerance at turn-off.

Figure 9A:
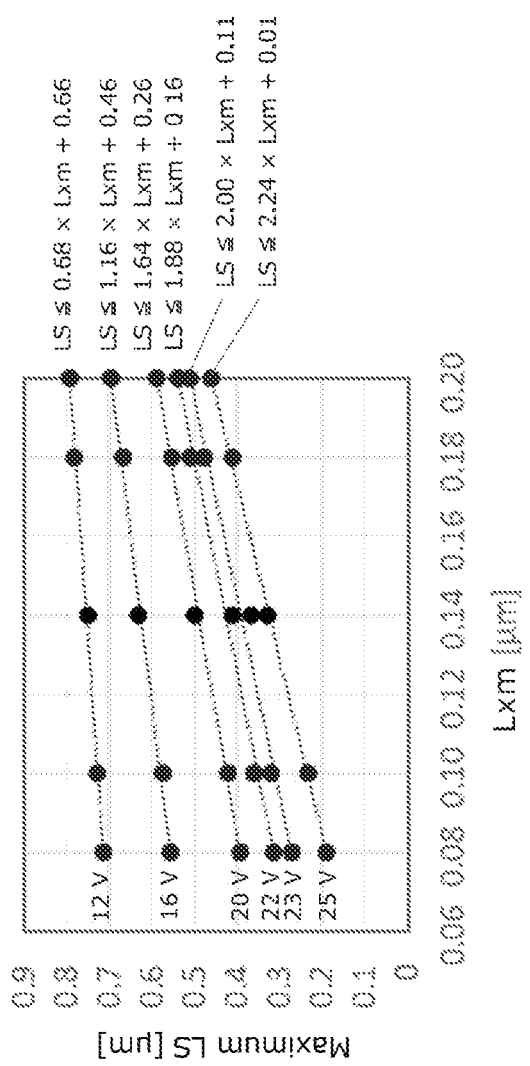
FIG. 9A illustrates a graph showing the relationship between (i) the maximum length of a source region in a first direction required for exceeding a desired withstand voltage at turn-off and (ii) a trench-to-trench distance, according to Embodiment 1.

Chart 3 below and FIG. 9A to FIG. 9C each indicate a part of the results of the calculation performed by the inventors. In the case of shortening trench-to-trench distances Lxm with an intension to reduce on-resistance, it is necessary to reduce length LS1 of each of first source regions 14 to a certain length or less in order to obtain desired withstand voltage at turn-off Voff. Chart 3 shows the maximum value of LS1 required to meet each Voff, and FIG. 9A shows the result of plotting the maximum value of LS1 required to meet each Voff in the range of 0.08 μm≤Lxm≤0.20 μm.

CHART 3

| Withstand voltage at turn-off Voff | Trench-to-trench distance L × m | | |
|---|---|---|---|
| | 0.10 μm | 0.14 μm | 0.18 μm |
| 12 V | 0.73 | 0.75 | 0.78 |
| 16 V | 0.58 | 0.63 | 0.67 |
| 20 V | 0.42 | 0.50 | 0.56 |
| 22 V | 0.36 | 0.41 | 0.51 |
| 23 V | 0.32 | 0.37 | 0.48 |
| 25 V | 0.23 | 0.33 | 0.41 |

As can be seen from Chart 3, the linear relationship between Lxm and the maximum length of first source region 14 is to be considered in order to reduce base resistance Rb1. This attributes to Rb1=p×LS1/Lxm/Lch. In order for Voff to exceed 22 V, for example, LS≤0.51 μm is required when Lxm=0.18 μm. Similarly, LS≤0.41 μm is required when Lxm=0.14 μm, and LS≤0.36 μm is required when Lxm=0.10 μm. The linear approximation of the plots shows that LS≤1.88×Lxm+0.16 [μm] needs to hold true, as indicated in FIG. 9A. Although the linear relationship between Lxm and maximum LS that holds true to meet each Voff can be likewise derived, maximum LS should be decreased as desired Voff increases or Lxm decreases.

Figure 9B:
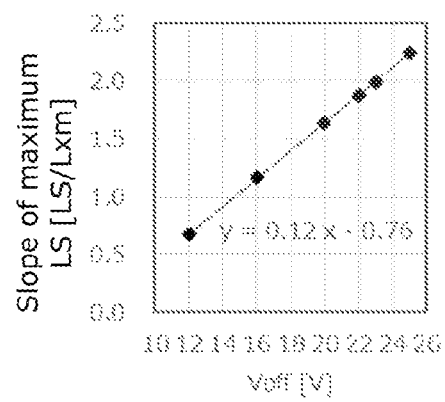
FIG. 9B illustrates a graph showing a slope in a linear relationship between (i) the maximum length of a source region in the first direction required for exceeding a desired withstand voltage at turn-off and (ii) a trench-to-trench distance, according to Embodiment 1.
Figure 9C:
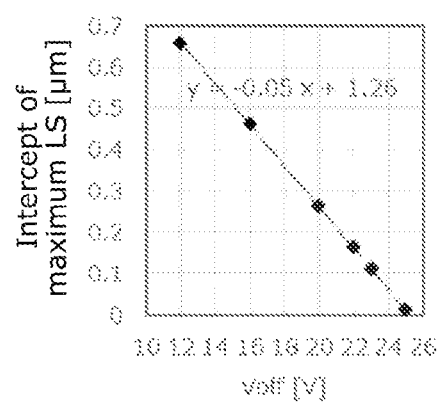
FIG. 9C illustrates a graph showing an intercept in the linear relationship between (i) the maximum length of a source region in the first direction required for exceeding a desired withstand voltage at turn-off and (ii) a trench-to-trench distance, according to Embodiment 1.

In the linear relationship between Lxm and maximum LS that holds true to meet desired Voff within the range of at least 12 V and at most 25 V, a slope continuously varies as shown in FIG. 9B and an intercept continuously varies as shown in FIG. 9C. Accordingly, if LS to be met in accordance with a change in Lxm is placed in an expression in consideration of Voff dependency, LS≤0.12×Voff×Lxm−0.76×Lxm−0.05×Voff+1.26 [μm] needs to hold true. In general, the withstand voltage at turn-off (Voff) of a field effect transistor is required to be at least the maximum specification voltage. It is therefore desirable to satisfy LS≤0.12×Vss×Lxm−0.76×Lxm−0.05×Vss+1.26 [μm] where Vss [V] denotes the maximum specification voltage. If LB<0.35 μm also holds true for length LB of each of the connection portions at the same time, it is possible to achieve also the reduction of on-resistance since the entire length of first body region 18 along the Y direction can be made contributable to conduction.

The primary purpose of the present application is to shorten Lxm with the view to reduce on-resistance, and enhance density at which the trenches are disposed. The present application defines that a region that satisfies the following is to be studied: trench-to-trench distance Lxm is at most trench inner width Lxr (Lxm≤Lxr); and Lxr≤0.20 μm. Chart 1 and Chart 2 show the results of calculation with Lxr=0.20 μm being fixed. The results shown in Chart 3 and FIG. 9A, however, are determined irrespective of the value of Lxr. This is because it is Lxm that determines base resistance Rb and Lxr has no effect on the determination result. Accordingly, it shouldn't impose any inconvenience in considering that the results shown in Chart 3 and FIG. 9A universally hold true under the precondition of Lxm Lxr≤0.20 μm according to the present application.

Based on the calculation results shown in Chart 3 and the range shown in FIG. 9A, FIG. 10 illustrates, in accordance with the relationship between Lxm and Lxr, the relationship between LS and LB under the conditions of, for example, Lxr=0.20 μm and Voff=22 V, which is desirable for appreciating the advantageous effects produced by semiconductor device 1 according to the present disclosure. The circle in the diagram indicates the maximum values of LS and LB with which the advantageous effects of semiconductor device 1 according to the present disclosure can be obtained when Lxm≤Lxr, and indicates LS=0.54 μm and LB=0.35 μm in this case. Note that LS=0.54 μm is a value calculated using Lxm=Lxr=0.20 μm in the expression corresponding to the case where Voff is 22 V in FIG. 9A. Accordingly, LS≤0.54 μm and LB<0.35 μm need to be satisfied when Lxm≤Lxr. The triangle in the diagram indicates the maximum values of LS and LB with which the advantageous effects of semiconductor device 1 according to the present disclosure can be obtained when Lxm≤Lxr/2, and indicates LS=0.35 μm and LB=0.35 μm in this case. Note that LS=0.35 μm is a value calculated using Lxm=Lxr/2=0.10 μm in the expression corresponding to the case where Voff is 22 V in FIG. 9A. Accordingly, LS≤0.35 μm and LB<0.35 μm need to be satisfied when Lxm≤Lxr/2. Physical characteristics in the case where Lxm is at most Lxr/2 will be described in Embodiment 2.

As described above, semiconductor device 1 according to Embodiment 1 includes first vertical field effect transistor 10 in which first source regions 14 and first connection portions 18A via which first body region 18 is connected to first source electrode 11 are alternately and cyclically disposed in the first direction (Y direction) in which first trenches 17 extend. In first vertical field effect transistor 10, distance Lxm between trenches 17 adjacent to each other in the second direction orthogonal to the first direction and inner width Lxr of trench 17 satisfy Lxm≤Lxr≤0.20 μm, and the lengths of first connection portions 18A are in a convergence region in which the on-resistance of first vertical field effect transistor 10 at the time when a voltage having a specification value is applied to first gate conductors 15 to supply a current having a specification value to transistor 10 does not decrease noticeably even when the lengths of first connection portions 18A are made much shorter. The same applies to second vertical field effect transistor 20.

With these features, a semiconductor device that can achieve both the reduction of on-resistance and the improvement of tolerance at turn-off is provided. In other words, it is possible to achieve both the reduction of on-resistance and the improvement of tolerance at turn-off, thereby easily implementing a circuit specification for circuits with high withstand voltage and low resistance which has been demanded in recent years.

Embodiment 2

Embodiment 1 has described with reference to FIG. 5A and FIG. 5B that it is possible to make the entire length of first body region 18 in the Y direction along first trench 17 contributable to conduction by changing length LB1 of each of first connection portions 18A. The same effect can be expected also in the X direction. This means nothing less than replacing length LB1 of each of first connection portions 18A in the Y direction with distance Lxm between adjacent first trenches 17 in the X direction.

When VGS is a threshold or higher, an inversion layer is generated in the vicinity of each of first trenches 17 in first body region 18. The inversion layer expands in the X direction and increases its thickness as VGS increases. If Lxm is short in this case, inversion layers formed in the vicinity of adjacent first trenches 17 join together, and this results in the state where the entirety of first body region 18 in the X direction may be contributable to conduction. This operation is the same as the operation performed for effectively utilizing first connection portions 18A for conduction regions in Embodiment 1. Accordingly, under the driving conditions for causing the entire length of first body region 18 in the Y direction along first trench 17 to contribute to conduction, if Lxm LB is also satisfied at the same time, the entire length of first body region 18 along the X direction excepting the inner lengths of first trenches 17 also contributes to conduction and on-resistance can be thus reduced.

In order to effectively utilize, as a conducting channel, an inversion layer formed in the X direction across regions between adjacent first trenches 17, it is desirable to provide first source regions 14 directly above first body region 18 at any location along the second direction. In other words, the conducting channel needs to be formed along a path that is as short as possible from the drain region (low-concentration impurity layer 33) to first source regions 14. Stated differently, it is better not to provide each of first source regions 14 with a region that is formed partly shallow in the Z direction somewhere between first trenches 17 adjacent to each other in the second direction.

Accordingly, it is desirable to define distance Lxm [μm] between first trenches 17 adjacent to each other in the second direction to be at most length LB [μm] of each of first connection portions 18A in the first direction, and have a structure in which layers of different conductivities are not alternately disposed when a region between adjacent first trenches 17 at any location along the first direction is viewed along the second direction at any location along a third direction (Z direction) orthogonal to the first direction and the second direction. With such a structure, it is possible to reduce on-resistance since a wide conduction region can be formed both in the first direction (Y direction) and the second direction (X direction) at the time of driving.

The inner portions of first trenches 17 do not structurally contribute to conduction in any way, but it is preferable to shorten the inner length of each of first trenches 17 and set the length to satisfy, for example, Lxr≤0.20 μm. For this, it is preferable to have first trenches 17 each having a shape such that the lateral walls of first trench 17 are formed as vertically as possible without any taper in the depth direction. Shortening Lxm is also effective for inversion layers formed in the vicinity of first trenches 17 on the both sides of Lxm to easily join together in the X direction at the time of driving. As a guiding indication, Lxm≤Lxr/2 is preferable. This allows the effective use of the entire length of first body region 18 in the X direction for conduction even in the case of driving with VGS much lower than VGS used when Lxr/2<Lxm≤Lxr, and it is thus possible to appreciate more the effect of reducing on-resistance. In other words, it is possible to apply a condition that can be interpreted as "VGS is high" to cases where VGS is low, thereby broadening flexibility in the use of semiconductor device 1. Note that regarding desirable ranges for the length of first source region 14 and the length of first connection portion 18A in the Y direction when Lxm≤Lxr/2, the case where Voff is 22 V is shown as an example in FIG. 10.

Embodiment 3

Figure 11A:
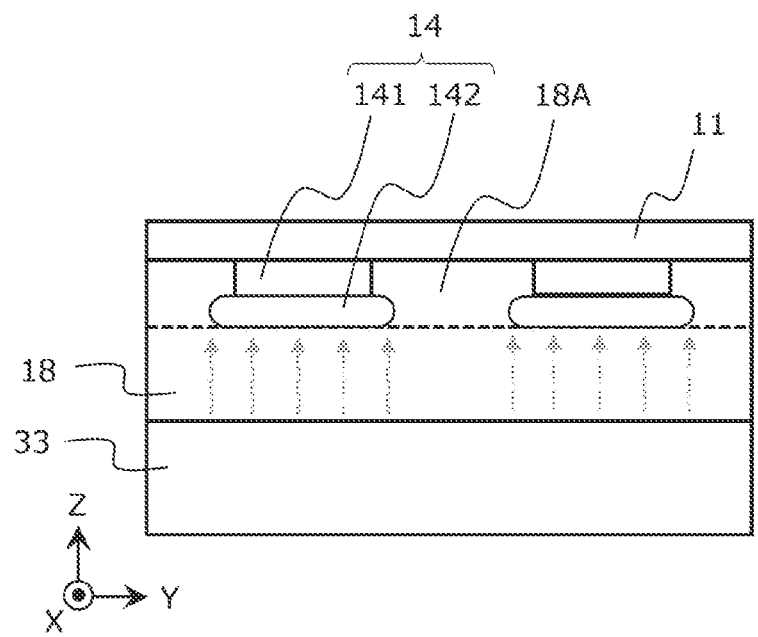
FIG. 11A is a schematic cross-sectional view of an example of the structure of a first transistor according to Embodiment 3.
Figure 11B:
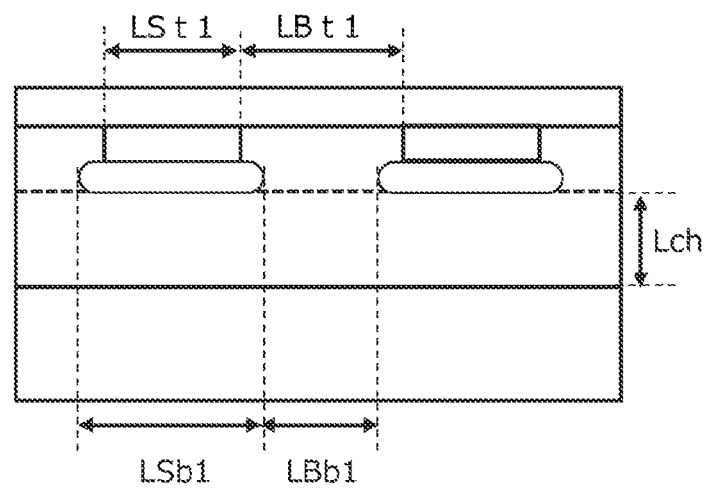
FIG. 11B is a schematic cross-sectional view of an example of the structure of the first transistor according to Embodiment 3.

The structure of each of first source regions 14 (or second source regions 24) can be changed appropriately in the Z direction (the depth direction of the semiconductor device) according to the functions of first source region 14 (or second source region 24). As illustrated in FIG. 11A and FIG. 11B, the structure of each of first source regions 14 may be divided into two parts that are separate in the Z direction: one part is top portion 141 located on the top surface side of semiconductor layer 40; and the other part is bottom portion 142 located on the side of the boundary with first body region 18.

Items related to the top side are presented with "t" for top and items related to the bottom side are presented with "b" for bottom. Length LS1 [μm] of first source region 14 is denoted as LSt1 [μm] for top portion 141 and LSb1 [μm] for bottom portion 142. Similarly, length LB1 [μm] of first connection portion 18A is denoted as LBt1 [μm] on the top side and LBb1 [μm] on the bottom side. Trench-to-trench distance Lxm and trench inner width Lxr that are defined by the same depth as the depth of bottom portion 142 of first source region 14 are denoted as Lxmb [μm] and Lxrb [μm], respectively, although not shown in FIG. 11A and FIG. 11B.

In order to effectively utilize, as a conducting channel, the entire length of first body region 18 along first trench 17 including the length of first body region 18 directly below each of first connection portions 18A at the time of driving transistor 10, it is necessary to shorten length LB1 of each of first connection portions 18A to a certain length or less, as stated in Embodiment 1. What is required here of each of first connection portions 18A is that length LBb1 on the bottom side which is close to the boundary with first body region 18 is shortened to a certain length or less, but length LBt1 on the top side does not need to be shortened. This is because the enlargement of a conducting channel at the time of the driving expands radially in the YZ plane from the bottom side of each of first source regions 14, as illustrated in FIG. 4C and FIG. 4E.

For this reason, in each of first source regions 14, length LSb1 of bottom portion 142 may be relatively long and length LSt1 of top portion 141 may be relatively short. This means that length LBb1 on the bottom side is relatively short and the length LBt1 on the top side is relatively long in each of first connection portions 18A.

Embodiment 1 (FIG. 4A) presupposes that length LS1 of each of first source regions 14 does not vary at all in the Z direction. In Embodiment 3 (FIG. 11A), the length of top portion 141 may be fixed, but the length of bottom portion 142 may vary. It is assumed that length LSb1 of bottom portion 142 is the longest length of bottom portion 142 in the Y direction. It is desirable to define LSb1 to be longer than length LSt1 of top portion 141 for the purpose, as described above, of enlarging a conduction region in the Y direction as effectively as possible at the time of driving. In order to obtain this effect, a location defined for length LSb1 of bottom portion 142 needs to be on the bottom side relative to a center in the Z direction of first source region 14, and more preferably, at the bottom of first source region 14 in the Z direction.

In other words, each of first source regions 14 includes: top portion 141 which is located on the top surface side of semiconductor layer 40 in the third direction (Z direction) orthogonal to the first direction (Y direction) and the second direction (X direction) and whose length in the first direction is fixed; and bottom portion 142 which is located on the side of the boundary with first body region 18 and whose length in the first direction varies. When top source length LSt1 denotes the length of top portion 141 in the first direction and bottom source length LSb1 denotes the longest length of bottom portion 142 in the first direction: bottom source length LSb1 is located on the bottom side relative to the center of first source region 14 in the third direction; bottom source length LSb1 is longer than top source length LSt1 (LSt1<LSb1); and length LS1 of each of first source regions 14 may be defined by bottom source length LSb1 (i.e., may be same as bottom source length LSb1) (LS1=LSb1).

In Embodiment 1 or Embodiment 2 according to the present application, length LS1 of each of first source regions 14 in the Z direction does not need to be fixed, and each of first source regions 14 may be composed of top portion 141 and bottom portion 142. In such a case, LS1, LB1 (LS2, LB2) may be read as LSb1, LBb1 (LSb2, LBb2), respectively, in the description of Embodiment 1 or Embodiment 2.

Figure 11C:
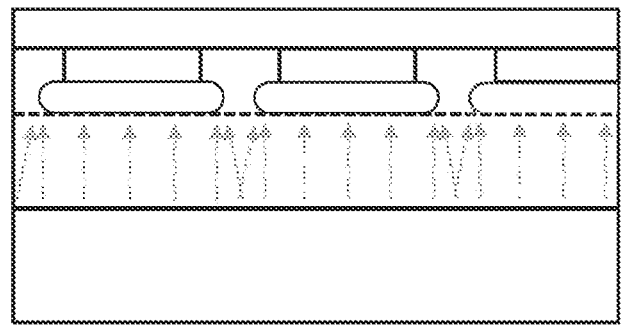
FIG. 11C is a schematic cross-sectional view of an example of the structure of the first transistor according to Embodiment 3.

Embodiment 1 (FIG. 4E) and Embodiment 3 (FIG. 11C) are compared again. Length LSb1 of first source region 14 on the bottom side in Embodiment 3 (FIG. 11C) is the same as length LS1 of first source region 14 in Embodiment 1 (FIG. 4E) (LS1=LSb1). This allows the width of a conducting channel to be same between Embodiment 1 and Embodiment 3 irrespective of the magnitude of VGS, and no obvious difference occurs in conductivity.

However, since LSt1 is short in Embodiment 3 (FIG. 11A), length LBt1 of first connection portion 18A on the top side is longer compared to length LB1 of first connection portion 18A in Embodiment 1. Such a structure is convenient for increasing the amount of implantation of a p-type impurity for first connection portions 18A and reducing the contact resistance between first body region 18 and first source electrode 11. This is because in the case of lengthening lengths LS1, in the Y direction, of first source regions 14 adjacent to first connection portions 18A, the amount of implantation of the p-type impurity for first connection portions 18A has to be reduced. Accordingly, if each of first source regions 14 is provided with a structure with short length LSt1 at the time of manufacturing, it is possible to increase the amount of implantation of the p-type impurity for first connection portions 18A adjacent to first source regions 14, and this makes it easier to reduce the contact resistance between first body region 18 and first source electrode 11.

Length LBt1 of first connection portion 18A on the top side gets longer than length LB1 of first connection portion 18A according to Embodiment 1 (LB1<LBt1) in the process in which carriers stored in the vicinity of first gate insulating films 16 pass through first body region 18 and first connection portions 18A and are instantaneously dispersed toward first source electrode 11. Accordingly, base resistance Rb1 decreases for the difference between LBt1 and LB1, and the effect of improving tolerance at turn-off can be obtained.

The present application primarily intends to effectively enlarge a conducting channel at the time of driving to the entire length of first body region 18 along first trench 17, and it is necessary to shorten the length of each of first connection portions 18A to a certain length or less for that. The shortening is changing the length of each of first connection portions 18A to be below 0.50 μm. If the lengths of first connection portions 18A are excessively shortened due to, for instance, workmanship variance in manufacturing, this might result in a decline in the functions of first connection portions 18A at turn-off. According to Embodiment 3, however, since it is possible to lengthen only LBt1, the effects of enhancing a margin for workmanship variance in manufacturing and thus securing the functions of first connection portions 18A at turn-off are produced, and conductivity at the time of driving is not to be deteriorated.

Figure 11D:
FIG. 11D is a schematic cross-sectional view of an example of the structure of the first transistor according to Embodiment 3.

FIG. 11A shows an example of the structure of each of first source regions 14 in which length LSb1 of bottom portion 142 is relatively long and length LSt1 of top portion 141 is relatively short. The length of top portion 141 in the Y direction is approximately the same at any location along the Z direction whereas the length of bottom portion 142 in the Y direction varies in the Z direction, although an example of the structure is not limited to the example shown in FIG. 11A. Bottom portion 142 has a shape such that the length in the Y direction is the longest at any location on the bottom side relative to the center of first source region 14 in the Z direction, as illustrated in FIG. 11A. Alternatively, bottom portion 142 may have a shape such that the length in the Y direction is the longest at its bottom that is the boundary with first body region 18 and the length monotonously decreases with closeness to top portion 141, as illustrated in FIG. 11D.

It is desirable to have length LSb1 of bottom portion 142 symmetrically longer at its both ends in the Y direction, compared to length LSt1 of top portion 141. In other words, top portion 141 and bottom portion 142 in first source region 14 may have the same center location in the first direction. With such a shape, conduction regions that radially enlarge from first source regions 14, which are adjacent to connection portion 18A in the Y direction, toward first body region 18 also become symmetric. A contribution can be thus equally obtained from adjacent first source regions 14 for making first body region 18 an effective conducting channel at the time of driving.

Moreover, length LSb1 of bottom portion 142 may be longer than length LSt1 of top portion 141 by at most approximately 0.05 μm equally at each of both ends of bottom portion 142 in the Y direction. In other words, it is desirable for length LSb1 and length LSt1 to satisfy LSt1<LSb1 and also LSb1≤LSt1+0.10 [μm]. With such a shape, it is possible, even in consideration of workmanship variance in manufacturing, to prevent the functions of first connection portions 18A from declining at turn-off due to adjacent first source regions 14 excessively approaching each other.

Since LSt1 is short in Embodiment 3 (FIG. 11A), the ratio between the length of first source region 14 (the length of top portion 141 to be strict) and the length of first connection portion 18A (the length of first connection portion 18A on the top side to be strict) in the Y direction in the plan view of the structure is different from the ratio between the length of bottom portion 142 and the length of first connection portion 18A on the bottom side. As described above, it is desirable to have long source regions (short connection portions) on the bottom side to enhance conductivity and long connection portions (short source regions) on the top side to improve tolerance at turn-off. Accordingly, it is preferable to change lengths LSb1 and LSt1 of first source region 14 and lengths LBb1 and LBt1 of first connection portion 18A so that LSb1≥LBt1 is satisfied on the bottom side and LSt1<LBt1 is satisfied on the top side. Stated differently, the ratio between the length of first source region 14 and the length of first connection portion 18A may be less than 1 on the top side (LSt1/LBt1<1), and may be 1 or greater on the bottom side (LSb1/LBt1≥1). Note that in order to achieve the above formulas together with LSb1≈LSt1+0.10 [μm], it is more preferable to satisfy LBt1−LSt1≤0.20 [μm].

It is described with reference to FIG. 5B that the parts (circles B) where the current flows intensively appear at the both ends of each of first source regions 14 in the Y direction. If the length of top portion 141 of each of first source regions 14 is made shorter (LSt1<LSb1), this encourages the current to flow more intensively in such parts and top portions 141 may be the cause of an increase in on-resistance at the time of driving. In order to prevent this, the n-type impurity concentration of top portion 141 may be increased to be higher than the n-type impurity concentration of bottom portion 142, to reduce conduction resistance. In other words, the impurity concentration of top portion 141 may be higher than the impurity concentration of bottom portion 142 in each of first source regions 14.

As illustrated in FIG. 11A and FIG. 11D, there are various methods to manufacture a structure that satisfies LSt1<LSb1 in each of first source regions 14. For example, in the implantation of an n-type impurity for first source regions 14, the implantation is firstly performed on bottom portions 142 with high acceleration energy, and after changing the conditions for implantation, the impurity implantation is subsequently performed on top portions 141. If the impurity implantation is performed on top portions 141 using acceleration energy relatively lower than the acceleration energy used for the impurity implantation performed on bottom portions 142, the impurity stays only at shallowly limited portions (the top portions). It is therefore possible to diffuse the implanted impurity more broadly also in the Y direction for bottom portions 142 compared to top portions 141.

The effect of progressive impurity diffusion of bottom portions 142 in the Y direction obtained by performing thermal treatment such as annealing after impurity implantation is performed on first source regions 14 may be utilized. Furthermore, the following manufacturing method may be used: firstly, forming first source regions 14, and then shallowly implanting a p-type impurity exclusively on certain regions that are limited in the Y direction along which first connection portions 18A are to be formed, as a result of which bottom portions 142 of first source regions 14 are formed.

There are various methods to measure length LS1 of a first source region, and the following is an example among those methods. First, cut transistor 10 along the Y direction parallel to first trench 17 and measure a certain range in a cross section using scanning capacitance microscopy (SCM). With the SCM, although it is difficult to measure the impurity concentration of a semiconductor on an observation surface, the conductivity type of a semiconductor can be measured with high accuracy. It is therefore possible to perform mapping of the conductivity types of semiconductors on a cross section. In the SCM, the difference between n type and p type is normally presented by a capacitance change that is dependent on carrier concentration, and a numerical data item whose absolute value indicates the signal strength of the polarity of a conductivity type is obtained for each unit area that has been measured. A certain range to be subjected to the SCM measurement is selected so that first source region 14 and first connection portion 18A are alternately included plurality of times in the selected range.

Subsequently, after a quick overview of numerical data items that are obtained, determine a location along the Z direction which is considered to be a location where the length of first source region 14 in the Y direction is maximum or in the proximity of the maximum length. By presenting, in a graph, the numerical data items obtained for the Y direction at the determined location along the Z direction, it is possible to obtain a profile with the horizontal axis indicating a location along the Y direction and the vertical axis indicating a conductivity type and the signal strength of the polarity of the conductivity type. Since a part where the vertical axis indicates 0 can be interpreted as a location corresponding to the boundary between n type and p type, it shouldn't impose any inconvenience in considering that a part where the vertical axis indicates 0 in an alternate manner is a part where the boundary between first source region 14 and first connection portion 18A appears alternately. Accordingly, it is possible to measure length LS for each first source region 14 and length LB for each first connection portion 18A included in a certain range subjected to the measurement. If the certain range includes multiple first source regions 14 and multiple first connection portions 18A, it is appropriate to determine LS by calculating the average value of lengths LS of first source regions 14 and determine LB by calculating the average value of lengths LB of first connection portions 18A.

Although the semiconductor device according to the present disclosure has been described above based on Embodiments 1 to 3, the present disclosure is not limited to these embodiments. Various modifications to the embodiments which may be conceived by those skilled in the art, as well as other forms resulting from combinations of one or more elements from different embodiments are also included within the scope of the present disclosure so long as they do not depart from the essence of the present disclosure.

INDUSTRIAL APPLICABILITY

A semiconductor device including a vertical field effect transistor according to the present disclosure can be widely used as a device that controls the conduction state of a current path.

The invention claimed is:

1. A semiconductor device of chip-size package type that is face-down mountable, the semiconductor device comprising:
   a semiconductor substrate that comprises silicon and contains an impurity of a first conductivity type;
   a low-concentration impurity layer on and in contact with the semiconductor substrate, the low-concentration impurity layer containing an impurity of the first conductivity type having a concentration lower than a concentration of the impurity of the first conductivity type in the semiconductor substrate; and
   a vertical field effect transistor including:
      a body region of a second conductivity type in a surface of the low-concentration impurity layer, the second conductivity type being different from the first conductivity type;
      source regions of the first conductivity type in a surface of the body region;
      a source electrode electrically connected to the source regions;
      a plurality of trenches extending in a first direction parallel to a top surface of the semiconductor substrate and aligned at regular intervals in a second direction orthogonal to the first direction, each of the plurality of trenches having a depth penetrating the body region from a top surface of the low-concentration impurity layer and not reaching a bottom of the low-concentration impurity layer;
      gate insulating films, each of which covers at least a portion of a surface of a corresponding trench among the plurality of trenches;
      gate conductors, each of which is disposed on a corresponding gate insulating film among the gate insulating films; and
      connection portions that electrically connect the body region and the source electrode, wherein
   the source regions and the connection portions are alternately and cyclically disposed in the first direction in the vertical field effect transistor,
   Lxm≤Lxr≤0.20 μm holds true where Lxm [μm] denotes a trench-to-trench distance between adjacent trenches that are adjacent to each other in the second direction among the plurality of trenches, and Lxr [μm] denotes an inner width of one trench among the plurality of trenches, and
   the following formulas hold true:
      LB<0.35 μm; and
      LS≤0.12×Vss×Lxm−0.76×Lxm−0.05×Vss+1.26 [μm],
         where LB [μm] denotes a length, in the first direction, of one connection portion among the connection portions, LS [μm] denotes a length, in the first direction, of one source region among the source regions, and Vss [V] denotes a maximum specification voltage of the vertical field effect transistor.

2. The semiconductor device according to claim 1, wherein
   LB<0.30 μm.

3. The semiconductor device according to claim 1, wherein
   the trench-to-trench distance Lxm [μm] in the second direction is at most the length LB [μm] of each of the connection portions in the first direction, and
   when a region between the adjacent trenches at any location along the first direction is viewed along the second direction at any location along a third direction orthogonal to the first direction and the second direction, layers of different conductivity types are not alternately disposed.

4. The semiconductor device according to claim 3, wherein
   the lengths, in the first direction, of the connection portions of the vertical field effect transistor are in a convergence region in which on-resistance of the vertical field effect transistor at a time when a voltage having a specification value is applied to the gate conductors to supply a current having a specification value to the vertical field effect transistor does not decrease noticeably even when the lengths of the connection portions are made much shorter.

5. The semiconductor device according to claim 3, wherein
   Lxm≤Lxr/2 holds true.

6. The semiconductor device according to claim 1, wherein
   in a third direction orthogonal to the first direction and the second direction:
      each of the source regions includes (i) a top portion which is located on a top surface side of the low-concentration impurity layer and whose length in the first direction is fixed, and (ii) a bottom portion which is located on a side of a boundary with the body region and whose length in the first direction varies, and
   when a length of the top portion in the first direction is defined to be a top source length, and a longest length of the bottom portion in the first direction is defined to be a bottom source length:
      the bottom source length is a length of the bottom portion on a bottom side relative to a center of the one source region in the third direction; and
      the bottom source length is longer than the top source length, and the length of each of the source regions is same as the bottom source length.

7. The semiconductor device according to claim 6, wherein
   the top portion and the bottom portion in the one source region have a same center location in the first direction.

8. The semiconductor device according to claim 6, wherein
   a ratio of the length of the one source region to the length of the one connection portion in the first direction is less than 1 on the top side and is 1 or greater on the bottom side.

9. The semiconductor device according to claim 8, wherein
   on the top side, a difference between the length of the one source region and the length of the one connection portion in the first direction is at most 0.20 μm.

10. The semiconductor device according to claim 6, wherein
   in each of the source regions, an impurity concentration of the top portion is higher than an impurity concentration of the bottom portion.

* * * * *